United States Patent
Fujiki et al.

(10) Patent No.: US 12,099,302 B2
(45) Date of Patent: Sep. 24, 2024

(54) FLEXOGRAPHIC PRINTING RAW PLATE AND MANUFACTURING METHOD OF FLEXOGRAPHIC PRINTING PLATE

(71) Applicant: ASAHI KASEI KABUSHIKI KAISHA, Tokyo (JP)

(72) Inventors: Yuzo Fujiki, Tokyo (JP); Hiroshi Ogawa, Tokyo (JP); Hideo Saito, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 540 days.

(21) Appl. No.: 17/299,002

(22) PCT Filed: Dec. 9, 2019

(86) PCT No.: PCT/JP2019/048042
§ 371 (c)(1),
(2) Date: Jun. 2, 2021

(87) PCT Pub. No.: WO2020/122001
PCT Pub. Date: Jun. 18, 2020

(65) Prior Publication Data
US 2022/0043352 A1    Feb. 10, 2022

(30) Foreign Application Priority Data

Dec. 10, 2018 (JP) ................ 2018-230516

(51) Int. Cl.
G03F 7/11 (2006.01)
B41C 1/05 (2006.01)
B41N 1/00 (2006.01)

(52) U.S. Cl.
CPC ............... G03F 7/11 (2013.01); B41C 1/05 (2013.01); B41N 1/006 (2013.01)

(58) Field of Classification Search
CPC ..................................................... G03F 7/11
See application file for complete search history.

(56) References Cited

U.S. PATENT DOCUMENTS

| 5,262,275 A | 11/1993 | Fan |
| 8,991,312 B2 | 3/2015 | Yoshimoto et al. |
| 2006/0063109 A1* | 3/2006 | Choi .............. G03F 7/202 430/300 |
| 2010/0075118 A1 | 3/2010 | Sugasaki |
| 2011/0023739 A1 | 2/2011 | Yuoshimoto et al. |
| 2012/0156514 A1 | 6/2012 | Yoshimoto et al. |
| 2012/0171620 A1 | 7/2012 | Bryant |
| 2012/0270156 A1 | 10/2012 | Vest et al. |
| 2013/0344440 A1 | 12/2013 | Suzuki |
| 2017/0225446 A1 | 8/2017 | Vest |
| 2018/0170088 A1 | 6/2018 | Beyer et al. |
| 2018/0356730 A1 | 12/2018 | Inasaki et al. |
| 2019/0105937 A1 | 4/2019 | Ichihashi |

FOREIGN PATENT DOCUMENTS

| EP | 2 461 215 | 6/2012 |
| JP | 7-506201 | 7/1995 |
| JP | 2008-512720 | 4/2006 |
| JP | 4051083 | 12/2007 |
| JP | 4332865 | 7/2009 |
| JP | 2010-100047 | 5/2010 |
| JP | 2014-507677 | 3/2014 |
| JP | 2014-512576 | 5/2014 |
| JP | 5573675 | 7/2014 |
| JP | 2018-517179 | 6/2018 |
| JP | 2020013066 A * | 1/2020 |
| WO | 2006/036253 | 4/2006 |
| WO | 2009/141930 | 11/2009 |
| WO | 2011/013601 | 2/2011 |
| WO | 2017/141882 | 8/2017 |
| WO | 2017/170573 | 10/2017 |

OTHER PUBLICATIONS

European Search Report for issued in Application No. 19895936.3, dated Dec. 3, 2021.
English language translation of International Search Report issued in PCT/JP2019/048042, dated Mar. 3, 2020.
English language translation of International Preliminary Report on Patentability issued in PCT/JP2019/048042, dated Jun. 8, 2021.

* cited by examiner

Primary Examiner — Chanceity N Robinson
(74) Attorney, Agent, or Firm — GREENBLUM & BERNSTEIN, P.L.C.

(57) ABSTRACT

A flexographic printing raw plate comprising at least a support, a photosensitive resin composition layer, an intermediate layer, and an infrared ablation layer sequentially stacked, wherein
the intermediate layer comprises a hydrophilic resin (A) and a layered inorganic compound (B), and
the intermediate layer has a film thickness of 2 μm or more and 30 μm or less.

7 Claims, No Drawings

FLEXOGRAPHIC PRINTING RAW PLATE AND MANUFACTURING METHOD OF FLEXOGRAPHIC PRINTING PLATE

TECHNICAL FIELD

The present invention relates to a flexographic printing raw plate and a manufacturing method of a flexographic printing plate.

BACKGROUND ART

Flexographic printing is one type of letterpress printing and is advantageously applicable to various printing objects as soft materials such as rubber and synthetic resin are used for flexographic printing plates.

A method in which plate making is carried out using a negative film and a method involving use of computer to plate technology (hereinafter, CTP technology) in which information processed on a computer is directly drawn on a printing plate to produce relief are conventionally known as a manufacturing method of a flexographic printing plate used for flexographic printing.

In the method using the CTP technology described above, a step of manufacturing a negative film is not needed, and costs and time required to manufacture a negative film are thus reduced. Therefore, the method involving use of CTP technology has become mainstream recently.

When CTP technology is used, a sheet in which a photosensitive resin composition layer, a protective layer (barrier layer), and an infrared ablation layer are stacked in sequence on a substrate such as PET resin is usually used as a raw plate of a flexographic printing plate (hereinafter, sometimes referred to as a flexographic printing raw plate).

Production of a flexographic printing plate is carried out in the following manner, for example.

Firstly, a uniform cured layer is formed by performing back exposure in which the entire surface of a photosensitive resin composition layer is irradiated with ultraviolet light through a substrate of a film of PET resin or the like.

Then, lithography is performed by irradiating, with a laser, an infrared ablation layer on the photosensitive resin composition layer to remove a part of the infrared ablation layer, thereby producing an image mask.

Furthermore, relief exposure in which the photosensitive resin composition layer is irradiated with ultraviolet light through the image mask is performed to photocure the part at which the infrared ablation layer has been removed.

Thereafter, the unexposed part (that is, the part not photocured) of the photosensitive resin composition layer is removed to form a relief image, which is a desired image, and a flexographic printing plate is thus obtained.

The relief image includes plural printing dots, and the shape of the printing dots and the relief depth affect image quality of a printed matter. In recent years, printed matters are highly required to have higher definition. Also, a printed matter having an area with a bright image (generally called a highlight) is demanded, and in order to appropriately represent a highlight area, it is required that printing dots with quite small dimensions are printed.

In view of the above-described circumstances, a flexographic printing plate capable of forming a relief image with a deep relief depth while forming micro-sized dots is demanded.

However, if oxygen exists at the time of performing relief exposure by irradiating a flexographic printing raw plate with ultraviolet light, oxygen radicals generated from oxygen inhibit photocuring reaction of a photosensitive resin composition, resulting in insufficient photocuring of the photosensitive resin composition layer.

Therefore, a technique of adjusting the shape of printing dots and a technique in which a mask layer capable of being laser-ablated is stacked on the photosensitive resin composition layer to form a printing dot structure having a flat top and a precipitous shoulder are heretofore disclosed (see Patent Literatures 1 and 2, for example).

In addition, a technique of providing one or more barrier layers to a flexographic printing raw plate for the purpose of covering the surface of a tackiness photosensitive resin composition layer and blocking oxygen in the atmosphere is disclosed (see Patent Literature 3, for example).

Furthermore, it is important that the infrared ablation layer has no defect (pin hole) for forming a relief image with a deep relief depth while forming micro-sized dots.

When the infrared ablation layer has a pin hole, the photosensitive resin composition layer adjacent to the pin hole is exposed at the time of performing relief exposure, causing an unintended image to be formed; consequently, the following problems arise: micro dots cannot be formed, and relief with a shallow relief depth is unintentionally formed.

Examples of a method of forming an infrared ablation layer includes a method involving directly forming an infrared ablation layer on a photosensitive resin composition layer by coating, and also a method in which an infrared ablation layer is made on a cover sheet by coating, followed by laminating a photosensitive resin composition layer on the infrared ablation layer side to transfer and stack to thereby form the infrared ablation layer.

When the infrared ablation layer is formed by a method in which an infrared ablation layer made on a cover sheet by coating and the photosensitive resin composition layer are laminated, a pin hole may be generated due to uneven coating or cissing occurring when the infrared ablation layer is made on the cover sheet by coating; besides, a pin hole may be generated by storing the cover sheet coated with the infrared ablation layer or impact thereon during transportation or by the temperature or pressure at lamination or a photosensitive resin composition kneaded and extruded at the time of laminating the infrared ablation layer and the photosensitive resin composition layer.

In view of the above-described circumstances, a technique of providing a protective layer (barrier layer) having an oxygen blocking property and a function for protecting the infrared ablation layer has been suggested.

As a barrier layer having an oxygen blocking property, a polyvinyl alcohol resin layer is generally known.

However, a film formed of polyvinyl alcohol resin has the following problems: the film has poor bending resistance, and the film is easily cracked and gets wrinkled. Flexographic printing plates are required to be flexible in view of their characteristics, and there is a problem in using such polyvinyl alcohol resin as described above.

In response to this, a technique of adjusting the film thickness and Young's modulus of resin for a barrier layer is suggested (see Patent Literatures 4 and 5, for example).

CITATION LIST

Patent Literature

Patent Literature 1: Japanese Translation of PCT International Application Publication No. 2014-512576

Patent Literature 2: Japanese Translation of PCT International Application Publication No. 2014-507677
Patent Literature 3: Japanese Translation of PCT International Application Publication No. 1995-506201
Patent Literature 4: Japanese Patent No. 4332865
Patent Literature 5: Japanese Patent No. 5573675

SUMMARY OF INVENTION

Technical Problem

However, while the polyvinyl alcohol resin suggested in Patent Literatures 4 and 5 can form a protective layer having an excellent oxygen blocking property, the polyvinyl alcohol resin has the following problems: the polyvinyl alcohol resin is likely to be cracked and get wrinkled by its nature, and especially when the infrared ablation layer is formed by a method in which an infrared ablation layer made on a cover sheet by coating and a photosensitive resin composition layer are laminated together with a protective layer, the protective layer is easily broken to generate a pin hole in the infrared ablation layer to thereby fail to develop the oxygen blocking property as intended, and thus a flexographic printing plate capable of forming a relief image with a deep relief depth while forming micro dots is not obtained.

Therefore, giving consideration to the problems in conventional techniques, the present invention aims at providing a flexographic printing raw plate excellent in pin hole resistance and having high cleanability, and a manufacturing method of a flexographic printing plate excellent in printing characteristics using the flexographic printing raw plate.

Solution to Problem

The present inventors have made intensive studies to solve the above-described problems, and as a result, found that by virtue of a flexographic printing raw plate in which an intermediate layer containing a hydrophilic resin and a layered inorganic compound is provided between a photosensitive resin composition layer and an infrared ablation layer, a relief image with a deep relief depth can be formed while forming micro dots, and that a flexographic printing plate capable of printing a highlight area with high definition is obtained; thus, the present invention has been accomplished.

Specifically, the present invention is as follows.

[1]
A flexographic printing raw plate comprising at least a support, a photosensitive resin composition layer, an intermediate layer, and an infrared ablation layer sequentially stacked, wherein
the intermediate layer comprises a hydrophilic resin (A) and a layered inorganic compound (B), and
the intermediate layer has a film thickness of 2 μm or more and 30 μm or less.

[2]
The flexographic printing raw plate according to [1] above, in which the intermediate layer includes 0.1 to 20 parts by mass of the layered inorganic compound (B) per 100 parts by mass of the hydrophilic resin (A).

[3]
The flexographic printing raw plate according to [1] or [2] above, wherein
the layered inorganic compound (B) is water-swellable synthetic mica.

[4]
The flexographic printing raw plate according to any one of [1] to [3] above, wherein
the intermediate layer further comprises a water-dispersible latex (C).

[5]
The flexographic printing raw plate according to [4] above, wherein
the intermediate layer comprises 5 to 45 parts by mass of the water-dispersion latex (C) per 100 parts by mass of the hydrophilic resin (A).

[6]
The flexographic printing raw plate according to any one of [1] to [5] above, wherein
a gel fraction of the intermediate layer is 10% or more and 90% or less, the gel fraction being calculated according to the following equation:

gel fraction (%)=(mass of intermediate layer having been immersed in pure water at room temperature for 72 hours followed by drying at 50° C. for three hours/mass of intermediate layer before being immersed in pure water)×100.

[7]
A manufacturing method of a flexographic printing plate, comprising:
a step of producing a negative pattern by subjecting the infrared ablation layer of the flexographic printing raw plate according to any one of [1] to [6] above to laser ablation;
a step of selectively exposing the photosensitive resin composition layer through the negative pattern; and
a step of removing an unexposed part of the photosensitive resin composition layer.

Advantageous Effect of Invention

According to the present invention, a flexographic printing raw plate excellent in pin hole resistance and having high cleanability, and a manufacturing method of a flexographic printing plate excellent in printing characteristics using the flexographic printing raw plate can be provided.

DESCRIPTION OF EMBODIMENT

Hereinafter, a mode for carrying out the present invention (hereinafter, referred to as the "present embodiment") will be described in detail. However, the present invention is not limited thereto, and various modifications can be made without departing from the spirit of the present invention.

[Flexographic Printing Raw Plate]

The flexographic printing raw plate of the present embodiment includes at least a support, a photosensitive resin composition layer, an intermediate layer, and an infrared ablation layer sequentially stacked, in which
the intermediate layer includes a hydrophilic resin (A) and a layered inorganic compound (B), and
the intermediate layer has a film thickness of 2 μm or more and 30 μm or less.

The flexographic printing raw plate of the present embodiment includes the support, the photosensitive resin composition layer, the intermediate layer, and the infrared ablation layer as essential constituents. The flexographic printing raw plate of the present embodiment has a configuration in which at least these layers are stacked in the above-described order, and the flexographic printing raw plate of the present embodiment may have a configuration in which a functional layer such as an adhesive layer is appropriately provided between these layers.

(Support)

The support used for the flexographic printing raw plate of the present embodiment is not particularly limited, and examples thereof include a polypropylene film, a polyethylene film, a film of a polyester such as polyethylene terephthalate and polyethylene naphthalate, and a polyamide film.

A dimensionally stable polyester film with a thickness of 75 μm to 300 μm is preferable as the support.

In addition, an adhesive layer is preferably provided on the support.

Examples of material for the adhesive layer include a composition having a binder polymer such as polyurethane, polyamide, and a thermoplastic elastomer and an adhesive active ingredient such as an isocyanate compound and an ethylenically unsaturated compound.

Furthermore, various auxiliary additive components such as a plasticizer, a thermal-polymerization preventing agent, an ultraviolet absorber, a halation preventing agent, a photostabilizer, a photopolymerization initiator, a photopolymerizable monomer, and a dye can be added to the adhesive layer.

It is more preferable that at least one or more undercoating layers be provided in order to obtain greater adhesive strength between the adhesive layer and a polyester film, which is the support.

(Photosensitive Resin Composition Layer)

Preferable examples of material for the photosensitive resin composition layer included in the flexographic printing raw plate of the present embodiment include a photosensitive resin composition including (a) a thermoplastic elastomer, (b) a hydrophilic copolymer, (c) a photopolymerizable monomer, and (d) a photopolymerization initiator.

Those described in "Japanese Patent Laid-Open No. 2018-120131" can be used as the compounds (a) to (d) described above, for example.

<(a) Thermoplastic Elastomer>

The thermoplastic elastomer (a) is preferably a thermoplastic elastomer containing at least one polymer block mainly including a conjugated diene and at least one polymer block mainly including a vinyl aromatic hydrocarbon.

The term "mainly including" used herein means accounting for 60% by mass or more of the polymer block.

In the polymer block mainly including a conjugated diene, the conjugated diene preferably accounts for 80% by mass or more and more preferably 90% by mass or more of the polymer block.

Examples of the conjugated diene include, but not limited to, monomers such as 1,3-butadiene, isoprene, 2,3-dimethyl-1,3-butadiene, 2-methyl-1,3-pentadiene, 1,3-hexadiene, 4,5-diethyl-1,3-octadiene, 3-butyl-1,3-octadiene, and chloroprene, and 1,3-butadiene is especially preferable in view of abrasion resistance. These monomers may be used singly or in combinations of two or more thereof.

A vinyl content in the total amount of the conjugated diene of the polymer block mainly including the conjugated diene, a content of 1,2-butadiene or 3,4-isoprene, for example, is not particularly limited. The vinyl content is preferably 5 mol % to 50 mol %, more preferably 8 mol % to 50 mol %, and still more preferably 10 mol % to 40 mol % in view of printing plate formability.

A number average molecular weight of the polymer block mainly including the conjugated diene is preferably 20,000 to 250,000, more preferably 30,000 to 200,000, and still more preferably 40,000 to 150,000 in view of wear resistance of the plate.

The polymer block mainly including the conjugated diene may contain an alkylene unit. An introducing method of the alkylene unit is not particularly limited, and examples thereof include a method involving polymerization using a monoolefin such as ethylene and butylene as a starting material monomer of the polymer block mainly including the conjugated diene, and a method involving hydrogenating conjugated diene polymer block. Especially, a method involving hydrogenating polymer block mainly including the conjugated diene is preferable in view of availability.

The content of the alkylene unit in the polymer block mainly including the conjugated diene is preferably 5 mol % or more in view of solvent resistance and is preferably 50 mol % or less in view of ensuring transparency of the resin composition. The content is more preferably in a range of 10 mol % to 35 mol %, and still more preferably in a range of 10 mol % to 25 mol %.

The alkylene unit is preferably contained in a polymer block mainly including butadiene. It is more preferable that the polymer block moiety mainly including butadiene be hydrogenated so as to contain all of a 1,4-butadiene unit, a 1,2-butadiene(vinyl) unit, and a butylene (alkylene) unit. It is further preferable that the polymer block mainly including butadiene contain at least a 1,4-butadiene unit, a 1,2-butadiene(vinyl) unit, and a butylene unit in ranges of 25 mol % to 70 mol %, 0 mol % to 50 mol %, and 10 mol % to 50 mol %, respectively.

The conjugated diene content, the vinyl content in the conjugated diene, and the content and ratio of the vinyl aromatic hydrocarbon can be measured using a nuclear magnetic resonance device ($^1$H-NMR).

Examples of the vinyl aromatic hydrocarbon include monomers such as styrene, t-butylstyrene, divinylbenzene, 1,1-diphenylstyrene, N,N-dimethyl-p-aminoethyl styrene, N,N-diethyl-p-aminoethyl styrene, vinylpyridine, p-methylstyrene, tertiary butylstyrene, α-methylstyrene, and 1,1-diphenylethylene. Especially, styrene is preferable because a flexographic printing raw plate with smoothness can be formed at a relatively low temperature (hereinafter, referred to as high formability). These monomers may be used singly, or in combinations of two or more thereof.

A number average molecular weight of the polymer block mainly including the vinyl aromatic hydrocarbon is preferably 100,000 or less in view of preventing orientation of a printing plate from being exhibited and is preferably 3,000 or more in view of chipping resistance during plate making and printing. The number average molecular weight of the polymer block mainly including the vinyl aromatic hydrocarbon is more preferably within a range of 5,000 to 80,000 and still more preferably within a range of 5,000 to 60,000.

The content of the vinyl aromatic hydrocarbon in the block copolymer is preferably 25% by mass or less in view of high formability of the photosensitive resin composition, high chipping resistance at a convex part of the printing plate, and keeping hardness of the printing plate high when an ink component attaches thereto. On the other hand, the content is preferably 13% by mass or more in view of enhancing cold flow resistance of the flexographic printing raw plate. The content is more preferably in a range of 15% by mass to 24% by mass, and still more preferably in a range of 16% by mass to 23% by mass.

The content of the thermoplastic elastomer (a) in the photosensitive resin composition layer is preferably 15% by mass to 90% by mass based on 100% by mass of the total amount of the photosensitive resin composition in view of wear resistance of the plate during printing. The content of the thermoplastic elastomer (a) is more preferably 15% by mass to 80% by mass and still more preferably 20% by mass to 75% by mass.

<(b) Hydrophilic Copolymer>

The hydrophilic copolymer (b) is internally-crosslinked polymer particles including a unit derived from a hydrophilic unsaturated monomer. Examples of the polymer particles include those obtained by removing water from a water-dispersible latex in which polymer particles as a dispersoid are dispersed in water, the polymer particles being obtained by subjecting a hydrophilic unsaturated monomer and optionally another monomer capable of being copolymerized therewith to emulsion polymerization. The amount of the unit derived from a hydrophilic unsaturated monomer may be 0.1% to 20% by mass, 0.5% to 15% by mass, or 1% to 10% by mass based on the total monomers, for example.

The hydrophilic unsaturated monomer is preferably a monomer including at least one hydrophilic group and an unsaturated double bond. Examples of the hydrophilic unsaturated monomer include a monomer including an unsaturated double bond and including any of a carboxylic acid group, a sulfonic acid group, a phosphoric acid group, and the like, salts thereof, and an acid anhydride group; a monomer including a hydroxy group and an unsaturated double bond; a monomer including an acrylamide and an unsaturated double bond; and a surfactant (monomer) including a reactive unsaturated double bond. These hydrophilic unsaturated monomers may be used singly, or two or more thereof may be used.

Examples of the water-dispersible latex include a water-dispersible latex polymer such as an acrylonitrile-butadiene copolymer latex, a polychloroprene latex, a polyisoprene latex, a polyurethane latex, a (meth)acrylate-butadiene latex, a vinylpyridine polymer latex, a butyl polymer latex, a Thiokol polymer latex, and an acrylate polymer latex.

In addition, a water-dispersible latex polymer in which any of these water-dispersible latexes is copolymerized with one or more of (meth)acrylate and unsaturated monomers containing an acidic functional group is preferable, examples of the unsaturated monomer including monobasic acids including carboxylic acids such as acrylic acid, methacrylic acid, crotonic acid, vinylbenzoic acid, and cinnamic acid and sulfonic acids such as styrene sulfonic acid; and dibasic acids such as itaconic acid, fumaric acid, maleic acid, citraconic acid, and muconic acid.

The water-dispersible latex may further include other polymer particles as a dispersoid in addition to polymer particles obtained by subjecting a hydrophilic unsaturated monomer and optionally another monomer capable of being copolymerized therewith to emulsion polymerization. Examples of such other polymer particles include particles of polybutadiene, natural rubber, and a styrene-butadiene copolymer.

Among these water-dispersible latexes, a water-dispersible latex containing a butadiene skeleton or an isoprene skeleton in a molecular chain of the polymer is preferable in view of wear resistance of the plate. For example, polybutadiene latex, styrene-butadiene copolymer latex, acrylonitrile-butadiene copolymer latex, and those obtained by copolymerizing any of these water-dispersible latexes with a (meth)acrylic acid ester, acrylic acid, methacrylic acid, itaconic acid, and the like are preferable. The water-dispersible latex is more preferably a water-dispersible latex of a copolymer in which one or more unsaturated monomers containing an acidic functional group such as a (meth) acrylic acid ester, acrylic acid, methacrylic acid, and itaconic acid are copolymerized with a styrene-butadiene copolymer.

An amount used of the unsaturated monomer containing an acidic functional group is preferably 1% to 30% by mass based on the total amount of unsaturated monomers used for synthesizing the hydrophilic copolymer (b). When the amount used is 1% by mass or more, aqueous developing tends to be easier. When the amount used is 30% by mass or less, an increase in the amount of moisture absorbed by the photosensitive resin composition and an increase in swelling by ink can be prevented, and deterioration in processability during mixing the photosensitive resin composition can be prevented.

Examples of an unsaturated monomer other than the unsaturated monomer containing an acidic functional group available for the synthesis of the hydrophilic copolymer (b) include, but not limited to, conjugated dienes, aromatic vinyl compounds, (meth)acrylic acid esters, ethylene-based monocarboxylic acid alkyl ester monomers having a hydroxy group, unsaturated dibasic acid alkyl esters, maleic anhydride, vinyl cyanide compounds, (meth)acrylamides and derivatives thereof, vinyl esters, vinyl ethers, vinyl halides, basic monomers having an amino group, vinylpyridine, olefins, silicon-containing $\alpha,\beta$-ethylenically unsaturated monomers, and allyl compounds.

Examples of the conjugated dienes include, but not limited to, 1,3-butadiene, isoprene, 2,3-dimethyl-1,3-butadiene, 2-ethyl-1,3-butadiene, 2-methyl-1,3-butadiene, 1,3-pentadiene, chloroprene, 2-chloro-1,3,-butadiene, and cyclopentadiene.

Examples of the aromatic vinyl compounds include, but not limited to, styrene, $\alpha$-methylstyrene, o-methylstyrene, m-methylstyrene, p-methylstyrene, ethylstyrene, vinyltoluene, vinylxylene, bromostyrene, vinylbenzyl chloride, p-t-butylstyrene, chrolostyrene, alkylstyrene, divinylbenzene, and trivinylbenzene.

Examples of the (meth)acrylic acid esters include, but not limited to, methyl (meth)acrylate, ethyl (meth)acrylate, propyl (meth)acrylate, n-butyl (meth)acrylate, t-butyl (meth) acrylate, isobutyl (meth) acrylate, n-amyl (meth) acrylate, isoamylhexyl (meth)acrylate, octyl (meth)acrylate, nonyl (meth)acrylate, decyl (meth)acrylate, dodecyl (meth) acrylate, octadecyl (meth) acrylate, cyclohexyl (meth)acrylate, phenyl (meth)acrylate, benzyl (meth) acrylate, 2-ethyl-hexyl (meth) acrylate, hydroxyethyl (meth) acrylate, hydroxypropyl (meth) acrylate, hydroxycyclohexyl (meth) acrylate, glycidyl (meth) acrylate, ethylene glycol di(meth)acrylate, ethylene glycol di(meth)acrylate, 1,3-butylene glycol di(meth)acrylate, 1,4-butylene glycol di(meth)acrylate, propylene glycol di(meth)acrylate, 1,5-pentanediol di(meth)acrylate, neopentyl glycol di(meth)acrylate, 1,6-hexanediol di(meth) acrylate, diethylene glycol di(meth)acrylate, triethylene glycol di(meth)acrylate, tetraethylene glycol di(meth)acrylate, polyethylene glycol di(meth)acrylate, polypropylene glycol di(meth)acrylate, pentaerythritol tri(meth)acrylate, trimethylolpropane tri(meth)acrylate, tetramethylolmethane tetra (meth)acrylate, allyl (meth) acrylate, bis(4-acryloxypolyethoxyphenyl)propane, methoxy polyethylene glycol (meth) acrylate, $\beta$-(meth)acryloyloxy ethylhydrogenphthalate, $\beta$-(meth)acryloyloxy ethylhydrogensuccinate, 3-chloro-2-hydroxypropyl (meth) acrylate, stearyl (meth) acrylate, phenoxyethyl (meth) acrylate, phenoxypolyethyleneglycol (meth)acrylate, 2-hydroxy-1,3-di(meth)acryloxypropane, 2,2-bis[4-((meth)acryloxyethoxy)phenyl]propane, 2,2-bis [4-((meth)acryloxy-diethoxy)phenyl]propane, 2,2-bis[4-((meth)acryloxy-polyethoxy)phenyl]propane, and isobornyl (meth) acrylate.

Examples of the ethylene-based monocarboxylic acid alkyl ester monomers having a hydroxy group include, but not limited to, 2-hydroxyethyl acrylate, 2-hydroxyethyl methacrylate, 2-hydroxypropyl acrylate, 2-hydroxypropyl methacrylate, 1-hydroxypropyl acrylate, 1-hydroxypropyl methacrylate, and hydroxycyclohexyl (meth) acrylate.

Examples of the unsaturated dibasic acid alkyl esters include, but not limited to, alkyl crotonates, alkyl itaconates, alkyl fumarates, and alkyl maleates.

Examples of the vinyl cyanide compounds include, but not limited to, acrylonitrile and methacrylonitrile.

Examples of the (meth)acrylamides and derivatives thereof include, but not limited to, (meth)acrylamide, N-methylol (meth)acrylamide, and N-alkoxy (meth)acrylamide.

Examples of the vinyl esters include, but not limited to, vinyl acetate, vinyl butyrate, vinyl stearate, vinyl laurate, vinyl myristate, vinyl propionate, and vinyl ester of versatic acid.

Examples of the vinyl ethers include, but not limited to, methyl vinyl ether, ethyl vinyl ether, propyl vinyl ether, butyl vinyl ether, amyl vinyl ether, and hexyl vinyl ether.

Examples of the vinyl halides include, but not limited to, vinyl chloride, vinyl bromide, vinyl fluoride, vinylidene chloride, and vinylidene fluoride.

Examples of the basic monomers having an amino group include, but not limited to, aminoethyl (meth)acrylate, dimethylaminoethyl (meth) acrylate, and diethylaminoethyl (meth) acrylate.

Examples of the olefins include, but not limited to, ethylene.

Examples of the silicon-containing α,β-ethylenically unsaturated monomers include, but not limited to, vinyltrichlorosilane and vinyltriethoxysilane.

Examples of the allyl compounds include, but not limited to, allyl esters and diallyl phthalates.

Besides, a monomer having three or more double bonds such as triallyl isocyanurate can be also used.

These monomers may be used singly, or two or more thereof may be mixed and used. The mass ratio between the unsaturated monomer containing an acidic functional group and the other monomers (unsaturated monomer containing acidic functional group/other monomers) is preferably 5/95 to 95/5 and more preferably 50/50 to 90/10.

When said ratio is 5/95 to 95/5, rubber elasticity of the photosensitive resin composition can be good in practical use.

The hydrophilic copolymer (b) is preferably a polymer synthesized through emulsion polymerization. In this case, an emulsifier (surfactant) used at the time of polymerization is preferably a reactive emulsifier.

The reactive emulsifier is preferably a reactive emulsifier including a radically polymerizable double bond, a hydrophilic functional group, and a hydrophobic group in its molecular structure and having emulsifying, dispersing, and swelling functions as with common emulsifiers. In addition, when the hydrophilic copolymer (b) is subjected to emulsion polymerization, it is preferable that an emulsifier (surfactant) capable of synthesizing a polymerization product having an average particle diameter of 5 to 500 nm be used when the reactive emulsifier is used in an amount of 0.1 parts by mass or more per 100 parts by mass of the unsaturated monomer containing an acidic functional group and the other monomers excluding the reactive emulsifier.

Examples of structure of the radically polymerizable double bond in the molecular structure of the reactive emulsifier include a vinyl group and an acryloyl group or a methacryloyl group.

Examples of the hydrophilic functional group in the molecular structure of the reactive emulsifier include anionic groups such as a sulfate group, a nitrate group, a phosphate group, a borate group, and a carboxy group; cationic groups such as an amino group; polyoxyalkylene chain structure or the like such as polyoxyethylene, polyoxymethylene, and polyoxypropylene; or hydroxy group.

Examples of the hydrophobic group in the molecular structure of the reactive emulsifier include an alkyl group and a phenyl group.

The reactive emulsifier includes an anionic emulsifier, a nonionic emulsifier, a cationic emulsifier, and an amphoteric emulsifier, according to the type of the hydrophilic functional group included in its structure. The radically polymerizable double bond, the hydrophilic functional group, and the hydrophobic group may each be included in the molecular structure in a combination of several types.

The commercially available surfactant can be used as the reactive emulsifier. The commercially available anionic surfactant is not particularly limited, and examples thereof include ADEKA REASOAP SE (manufactured by ADEKA Corporation), Aqualon HS, BC, and KH (manufactured by DKS Co. Ltd.), LATEMUL S (manufactured by Kao Corporation), Antox MS (manufactured by Nippon Nyukazai Co., Ltd.), ADEKA REASOAP SDX and PP (manufactured by ADEKA Corporation), Hightenol A (manufactured by DKS Co. Ltd.), ELEMINOL RS (manufactured by Sanyo Chemical Industries, Ltd.), and SPINOMAR (manufactured by Toyo Soda Kogyo Kabushiki Kaisha). The commercially available nonionic surfactant is not particularly limited, and examples thereof include Aqualon RN and Noigen N (manufactured by DKS Co. Ltd.) and ADEKA REASOAP NE (manufactured by ADEKA Corporation).

These may be used singly, or two or more thereof may be used in combination.

The amount of the reactive emulsifier used preferably falls within a range of 1 to 20 parts by mass per 100 parts by mass of the hydrophilic copolymer (b) calculated from the amount of starting materials fed. When the amount of the reactive emulsifier is 1 part by mass or more, image reproducibility of a printing plate obtained tends to improve, and when the amount of the reactive emulsifier is 20 parts by mass or less, wear resistance of the printing plate obtained tends to improve.

When the hydrophilic copolymer (b) is synthesized through emulsion polymerization, a non-reactive emulsifier can also be used as needed.

Examples of the non-reactive emulsifier include, but not limited to, anionic surfactants such as fatty acid soap, rosin acid soap, a sulfonate, a sulfate, a phosphate, a polyphosphate, and an acyl sarcosinate; cationic surfactants such as a nitrilated fat or oil derivative, a fat or oil derivative, a fatty acid derivative, and an α-olefin derivative; and nonionic surfactants such as an alcohol ethoxylate, an alkylphenol ethoxylate, a propoxylate, a fatty acid alkanolamide, an alkyl polyglycoside, a polyoxyethylene sorbitan fatty acid ester, and an oxyethylene oxypropylene block copolymer. These may be used singly, or two or more thereof may be used in combination.

Examples of the sulfonate include, but not limited to, an alkyl sulfonate, an alkyl sulfate, an alkyl sulfosuccinate, a polyoxyethylene alkyl sulfate, sulfonated fat or oil, an alkyldiphenylether disulfonate, an α-olefin sulfonate, an alkyl glyceryl ether sulfonate, and an N-acylmethyltaurate.

Other examples of the non-reactive emulsifier include those described in "Kaimenkasseizai handobukku (Surfactant Handbook) (Takahashi, Namba, Koike, Kobayashi: Kougakutosho Ltd., 1972)."

The amount of the non-reactive emulsifier used is preferably less than 1 part by mass per 100 parts by mass of the hydrophilic copolymer (b) calculated from an amount of starting material fed. When the amount of the non-reactive emulsifier used is less than 1 part by mass, a printing plate to be obtained has an appropriate water swelling ratio, and a decrease of abrasion resistance occurring when ink attaches and a decrease of image reproducibility after absorbing moisture can be prevented.

In a common emulsion polymerization method of the hydrophilic copolymer (b), predetermined amounts of water, an emulsifier, and other additives are fed, in advance, to a reaction system having been adjusted to a temperature at which polymerization is possible, and a polymerization initiator and an unsaturated monomer, an emulsifier, an adjuster, and the like are added into this reaction system by batch operation or continuous operation. In addition, a method in which predetermined amounts of a seed latex, a polymerization initiator, an unsaturated monomer, and another adjuster are added in advance to the reaction system as needed is also often used.

In addition, the layer structure of hydrophilic copolymer particles to be synthesized can also be changed stepwise by devising a method of adding the unsaturated monomer, emulsifier, other additives, and adjuster to the reaction system.

In this case, physical properties representing the structure of each layer include hydrophilicity, glass transition temperature, molecular weight, crosslinking density. The number of layers in this layer structure is not particularly limited.

A known chain transfer agent can be used in the polymerization step of the hydrophilic copolymer (b).

A chain transfer agent including sulfur can be preferably used as the chain transfer agent. Examples of the chain transfer agent including sulfur include, but not limited to, an alkanethiol such as t-dodecyl mercaptan and n-dodecyl mercaptan; a thioalkyl alcohol such as mercaptoethanol and mercaptopropanol; a thioalkyl carboxylic acid such as thioglycolic acid and thiopropionic acid; an alkyl thiocarboxylate acid such as octyl thioglycolate and octyl thiopropionate; and a sulfide such as dimethyl sulfide and diethyl sulfide.

Examples of the other chain transfer agents include, but not limited to, terpinolene, dipentene, t-terpinene, and a hydrocarbon halide such as carbon tetrachloride.

Among these chain transfer agents, alkanethiols are preferable because they have large chain transfer rates and give polymerization products having well-balanced physical properties.

These chain transfer agents may be used singly, or two or more thereof may be used in combination.

These chain transfer agents are mixed to monomers and then supplied to a reaction system or independently added in a predetermined amount at a predetermined time. The amount of these chain transfer agents used is preferably 0.1% to 10% by mass based on the total amount of unsaturated monomers used for polymerization of the hydrophilic copolymer (b).

The amount of 0.1% by mass or more provides good processability at the time of mixing the photosensitive resin composition, and the amount of 10% by mass or less enables the molecular weight of the hydrophilic copolymer (b) to be practically sufficient.

A polymerization reaction suppressing agent can be used for polymerization of the hydrophilic copolymer (b) as needed.

The polymerization reaction suppressing agent is a compound added to an emulsion polymerization system to decrease a radical polymerization rate. More specifically, the polymerization reaction suppressing agent includes a polymerization rate retardant, a polymerization inhibitor, a chain transfer agent with low radical reinitiation reactivity, and a monomer with low radical reinitiation reactivity. The polymerization reaction suppressing agent is usually used for adjusting a polymerization reaction rate and adjusting physical properties of a latex. These polymerization reaction suppressing agents are added to a reaction system by batch operation or continuous operation. When the polymerization reaction suppressing agent is used, strength of a latex coating improves, and wear resistance of the plate thus improves. While details of the reaction mechanism is unclear, the polymerization reaction suppressing agent is thought to closely relate to steric structure of a polymer, and it is assumed that the polymerization reaction suppressing agent thus has an effect of adjusting physical properties of a latex coating.

Examples of the polymerization reaction suppressing agent include, but not limited to, quinones such as o-, m-, or p-benzoquinone; nitro compounds such as nitrobenzene, o-, m-, or p-dinitrobenzene; amines such as diphenylamine; catechol derivatives such as tertiary butyl catechol; 1,1-di-substituted vinyl compounds such as 1,1-diphenylethylene or α-methylstyrene and 2,4-diphenyl-4-methyl-1-pentene; and 1,2-di-substituted vinyl compounds such as 2,4-diphenyl-4-methyl-2-pentene and cyclohexene. Besides, compounds described as a polymerization inhibitor or polymerization suppressing agent in "POLYMER HANDBOOK 3rd Ed. (J. Brandup, E. H. Immergut: John Wiley & Sons, 1989)," and "Kaitei koubunshigousei no kagaku (Chemistry of polymer synthesis revised edition) (Otsu: Kagaku-Dojin Publishing Company, INC, 1979)" are exemplified.

Among them, 2,4-diphenyl-4-methyl-1-pentene (α-methylstyrene dimer) is especially preferable in view of reactivity. These polymerization reaction suppressing agents may be used singly, or two or more thereof may be used in combination.

The amount of these polymerization reaction suppressing agents used is preferably 10% by mass or less based on the total amount of unsaturated monomers used for polymerization of the hydrophilic copolymer (b). By setting the amount to 10% by mass or less, a practically sufficient polymerization rate tends to be obtained.

The radical polymerization initiator, which is a preferable example of the polymerization initiator described above, is radically decomposed under the presence of heat or a reducing substance to initiate addition polymerization of monomers, and both of an inorganic initiator and an organic initiator can be used.

Examples of the radical polymerization initiator include, but not limited to, a water-soluble or oil-soluble peroxodisulfate, a peroxide, and an azobis compound, and specific examples thereof include potassium peroxodisulfate, sodium peroxodisulfate, ammonium peroxodisulfate, hydrogen peroxide, t-butyl hydroperoxide, benzoyl peroxide, 2,2-azobis butyronitrile, and cumene hydroperoxide.

Compounds described in POLYMER HANDBOOK (3rd edition), written by J. Brandup and E. H. Immergut, published by John Willy & Sons, (1989) can also be used as the radical polymerization initiator.

In addition, a so-called redox polymerization method, in which a reducing agent such as sodium acidic sulfite, ascorbic acid or a salt thereof, erythorbic acid and a salt thereof, or Rongalit is used in combination with a polymerization initiator, can also be employed.

Among them, peroxodisulfate is preferable as the polymerization initiator.

The amount of the polymerization initiator used usually falls within a range of 0.1% to 5.0% by mass and is preferably selected from a range of 0.2% to 3.0% by mass based on the total amount of unsaturated monomers used for polymerization of the hydrophilic copolymer (b).

When the amount of the polymerization initiator used is 0.1% by mass or more, high stability can be obtained at the time of synthesizing the hydrophilic copolymer (b), and when the amount of the polymerization initiator used is 5.0% by mass or less, the amount of moisture absorbed by the photosensitive resin composition can be reduced so as to fall within a practically preferable range.

Various polymerization adjusters can be added at the time of synthesizing the hydrophilic copolymer (b) as needed.

A pH adjuster can be added as a polymerization adjuster, and examples of the pH adjuster include, but not limited to, sodium hydroxide, potassium hydroxide, ammonium hydroxide, sodium hydrogen carbonate, sodium carbonate, and disodium hydrogen phosphate.

Various chelating agents such as sodium ethylenediaminetetraacetate, and the like can also be added as a polymerization adjuster.

Furthermore, as other additives, various additives may be added, including a viscosity reducing agent such as an alkali-sensitive latex and hexametaphosphoric acid; a water-soluble polymer such as a polyvinyl alcohol and carboxymethyl cellulose; a thickening agent; various antioxidants; an ultraviolet absorber; an antiseptic agent; a bactericidal agent; a defoaming agent; a dispersant such as sodium polyacrylate; a water resistant agent; a metal oxide such as zinc oxide; a crosslinking agent such as an isocyanate-based compound and an epoxy compound; a lubricant; and a water retaining agent.

A method for adding these additives is not particularly limited, and these additives can be added during synthesis or after synthesis of the hydrophilic copolymer (b).

The polymerization temperature in the case where the hydrophilic copolymer (b) is synthesized through emulsion polymerization is usually selected from a range of 60 to 120° C.

Polymerization may be carried out by the above-described redox polymerization method or the like at a lower temperature. Furthermore, a metal catalyst such as divalent iron ion, trivalent iron ion, and copper ion may be allowed to coexist as a redox catalyst.

The hydrophilic copolymer (b) is preferably particulate, and the average particle diameter thereof is preferably 500 nm or less and more preferably 100 nm or less. When the average particle diameter is 500 nm or less, a printing raw plate to be obtained has good aqueous developing performance.

The toluene gel fraction of the hydrophilic copolymer (b) is preferably 60% to 99%. When the gel fraction is 60% or more, practically sufficient strength tends to be imparted to a printing plate to be obtained.

When the gel fraction is 99% or less, mixing properties between the hydrophilic copolymer (b) and the thermoplastic elastomer (a) tend to be good.

The toluene gel fraction herein is a mass fraction (%) obtained as follows. An appropriate amount of a dispersion containing about 30% by mass of the hydrophilic copolymer (b) is dropped on a Teflon® sheet followed by drying at 130° C. for 30 minutes; 0.5 g of the hydrophilic copolymer (b) is taken therefrom and immersed in 30 mL of toluene at 25° C. followed by shaking for three hours using a shaking device and subsequent filtration with a 320 SUS mesh; the matter not passing through the mesh is dried at 130° C. for one hour; and the mass of the dried mater is divided by 0.5 (g).

For development in an aqueous developer, the content of the hydrophilic copolymer (b) in the photosensitive resin composition layer is preferably 10% by mass to 70% by mass based on 100% by mass of the total amount of the photosensitive resin composition in view of developing performance at the time of producing a printing plate. The content of the hydrophilic copolymer (b) is more preferably 15% by mass to 60% by mass and still more preferably 20% by mass to 50% by mass.

<(c) Photopolymerizable Monomer>

Examples of the photopolymerizable monomer (c) include, but not limited to, esters of acids such as acrylic acid, methacrylic acid, fumaric acid, and maleic acid; derivatives of acrylamides and methacrylamides; allyl esters, styrene, and derivatives thereof; and N-substituted maleimide compounds.

Examples of the photopolymerizable monomer (c) include, but not limited to, diacrylates and dimethacrylates of alkanediols such as 1,6-hexanediol and 1,9-nonanediol; or diacrylates and dimethacrylates of ethylene glycol, diethylene glycol, propylene glycol, dipropylene glycol, polyethylene glycol, butylene glycol, and dicyclopentadienyl; trimethylolpropane tri(meth)acrylate, dimethyloltricyclodecane di(meth)acrylate, isobornyl (meth) acrylate, phenoxypolyethyleneglycol (meth) acrylate, pentaerythrit tetra(meth)acrylate, N,N'-hexamethylenebisacrylamide and N,N'-hexamethylenebismethacrylamide, styrene, vinyltoluene, divinylbenzene, diacrylphthalate, triallyl cyanurate, diethyl fumarate, dibutyl fumarate, dioctyl fumarate, distearyl fumarate, butyl octyl fumarate, diphenyl fumarate, dibenzyl fumarate, dibutyl maleate, dioctyl maleate, bis(3-phenylpropyl) fumarate, dilauryl fumarate, dibehenyl fumarate, and N-lauryl maleimide.

These may be used singly, or two or more thereof may be used in combination.

It is preferable that the photosensitive resin composition contain, as the photopolymerizable monomer (c), 2.0% by mass or more of a monomer having 2 moles of methacrylate groups in view of higher chipping resistance at a convex part of a printing plate.

The content of the photopolymerizable monomer (c) in the photosensitive resin composition layer is preferably 1% by mass to 25% by mass based on 100% by mass of the total amount of the photosensitive resin composition in view of achieving bright printing. The content of the photopolymerizable monomer (c) is more preferably 5% by mass to 20% by mass and still more preferably 8% by mass to 15% by mass.

((d) Photopolymerization Initiator)

The photopolymerization initiator (d) is a compound absorbing energy of light and generating a radical. Various known initiators can be used therefor, and various organic carbonyl compounds, especially aromatic carbonyl compounds are preferably used.

Examples of the photopolymerization initiator (d) include, but not limited to, benzophenone, 4,4-bis(diethylamino)benzophenone, t-butyl anthraquinone, 2-ethyl anthraquinone, thioxanthones such as 2,4-diethylthioxanthone, isopropylthioxanthone, and 2,4-dichlorothioxanthone; acetophenones such as diethoxyacetophenone, 2,2-dimethoxy-phenylacetophenone, 2-hydroxy-2-methyl-1-phenyl-propane-1-on, benzyl dimethyl ketal, 1-hydroxycyclohexyl-phenyl ketone, 2-methyl-2-morpholino(4-thiomethylphenyl)propane-1-on, and 2-benzyl-2-dimethylamino-1-(4-morpholinophenyl)-butanone; benzoin ethers such as benzoin methyl ether, benzoin ethyl ether, benzoin isopropyl ether, and benzoin isobutyl ether; acylphosphine oxides such as 2,4,6-trimethylbenzoyldiphe-nylphosphine oxide, bis(2,6-dimethoxybenzoyl)-2,4,4-trimethylpentylphosphine oxide, and bis(2,4,6-trimethylbenzoyl)-phenylphosphine oxide; methyl benzoylformate; and 1,7-bisacridinylheptane; 9-phenylacridine; and 2,6-di-t-butyl-p-cresol.

These may be used singly, or two or more thereof may be used in combination.

The content of the photopolymerization initiator (d) in the photosensitive resin composition layer is preferably 0.1% by mass to 10.0% by mass based on 100% by mass of the total amount of the photosensitive resin composition in view of improving plate formability during plate making and achieving bright printing. The content of the photopolymerization initiator (d) is more preferably 1.0% by mass to 8.0% by mass and still more preferably 1.5% by mass to 5.0% by mass.

A cleavable photopolymerization initiator and a hydrogen-drawing type photopolymerization initiator may be used in combination as the photopolymerization initiator (d). The amount of the hydrogen-drawing type photopolymerization initiator in the photosensitive resin composition is preferably 1.0% by mass or less and more preferably 0.5% by mass or less because image reproducibility of a printing plate and abrasion resistance are high.

(Intermediate Layer)

The flexographic printing raw plate of the present embodiment has an intermediate layer between the above-described photosensitive resin composition layer and an infrared ablation layer described later.

In order to produce a printed matter having high definition and a highlight area, a micro dot which has a flat part of a dot tip with a diameter of 10 to 20 μm and also has a relief depth of 100 μm or more is required to be formed. The intermediate layer preferably has oxygen inhibiting ability so as to achieve such a micro dot.

When the photosensitive resin composition layer is cured by ultraviolet irradiation, curing is progressed through radical polymerization. When oxygen coexists at the time of polymerization, a radical-generating compound reacts with oxygen to suppress polymerization reaction. When an unreacted portion remains in the photosensitive resin composition layer due to suppression of polymerization reaction, the shape of a pattern finally formed has a curved portion at the tip thereof. On the other hand, when the amount of oxygen coexisting is decreased at the time of ultraviolet curing, polymerization reaction is unlikely to be suppressed, and the shape of a pattern finally formed has a flat part at the tip thereof. Accordingly, for preparing a pattern having a flat part at the tip thereof, it is effective to decrease oxygen contacting the photosensitive resin composition layer by imparting oxygen inhibiting ability to the intermediate layer.

In addition, the intermediate layer also has a function for protecting the infrared ablation layer described later.

In the manufacturing process of a conventional flexographic printing raw plate, the infrared ablation layer comes into contact with a roll at the time of feeding a film of the infrared ablation layer, or the infrared ablation layer and a protective film rub against each other due to winding constriction occurring during transportation of a film roll. These may cause brakeage of the infrared ablation layer physically, which may generate a pin hole.

The photosensitive resin composition layer and the infrared ablation layer may be stacked by a method in which the infrared ablation layer is coated with the photosensitive resin composition layer while extruding the photosensitive resin composition layer, and in such a case, a pin hole may be generated due to friction caused when the heated and melted photosensitive resin composition flows on the infrared ablation layer.

In order to prevent such generation of a pin hole in the infrared ablation layer, the intermediate layer included in the flexographic printing raw plate of the present embodiment is required to have physical strength and heat resistance.

As described above, in order to produce a printed matter having high definition and a highlight area, a micro dot in which a flat part of the dot tip has a diameter of 10 to 20 μm is required to be formed; therefore, if a mask image for forming micro dots overlaps the periphery of a pin hole of 20 μm or more in the infrared ablation layer, dot formation failure may occur to result in failure in production of a flexographic printing plate having high definition and a highlight area.

Furthermore, it is preferable that the intermediate layer can be cleaned with the same cleaning liquid as that for the infrared ablation layer and/or the photosensitive resin composition layer in view of simplicity of manufacturing process of a flexographic printing plate.

From such a viewpoint, the intermediate layer is preferably water-soluble or alkali-soluble.

When the intermediate layer has high cleanability, time required for a cleaning step can be shortened, workability improves, and the photosensitive resin composition layer located below the intermediate layer can be easily developed.

In the flexographic printing raw plate of the present embodiment, the intermediate layer contains a hydrophilic resin (A) and a layered inorganic compound (B). Consequently, the intermediate layer has an oxygen blocking property and is excellent in physical strength and heat resistance, and pin hole resistance thereof improves. Furthermore, cleanability of the intermediate layer also improves.

While the detailed reason thereof is not clear, the present inventors assume as follows.

The layered inorganic compound (B) is a compound obtained by dispersing a delaminated clay mineral in an aqueous solution or a compound obtained by dispersing crystalline inorganic fine particles in water. The clay mineral has a silanol group (SiOH) on its surface and can form a bond with a hydroxy group or the like. Furthermore, as the surface of the delaminated clay mineral has negative charge, the delaminated clay mineral can also form an ion bond with a cation such as quaternary ammonium ion. By virtue of crosslinked structure formed between this layered inorganic compound (B) and the hydrophilic resin (A), strength as the intermediate layer improves, and physical strength and heat resistance improve. Similarly, when an inorganic compound such as aluminum hydroxide, barium sulfate, and potassium titanate is included in the layered inorganic compound (B), functional groups on the surface thereof can also form a bond with a hydroxy group or the like. In addition, as the surfaces of the particles dispersed in water have negative charge, the particles can form an ion bond with a cation such as quaternary ammonium ion.

Furthermore, in a cleaning step, the intermediate layer is removed through decladding and not through dissolution, by virtue of crosslinked structure formed between the layered inorganic compound (B) and the hydrophilic resin (A); consequently, the removal rate is faster than the dissolution rate of the layered inorganic compound (B) in a cleaning liquid to improve cleanability.

In the intermediate layer, the larger the content of the layered inorganic compound (B) is, the more the oxygen blocking property, pin hole resistance, and cleanability improve. On the other hand, coating properties tends to deteriorate, and a film with a uniform thickness may be unlikely to be obtained. Taking the balance among them into consideration, the content of the layered inorganic compound (B) in the intermediate layer is preferably 0.1 parts by mass or more and 20 parts by mass or less, more preferably 1 part by mass or more, and still more preferably 1.5 parts by mass or more per 100 parts by mass of the hydrophilic resin (A). The content of the layered inorganic compound (B) in the intermediate layer is more preferably 10 parts by mass or less and still more preferably 8 parts by mass or less.

The thicker the thickness of the intermediate layer is, the more the oxygen inhibiting effect is enhanced, and physical strength and heat resistance are imparted. On the other hand, cleanability decreases.

Taking the balance among them into consideration, the thickness of the intermediate layer is 2 μm or more and 30 μm or less, preferably 2.5 μm or more, and still more preferably 3 μm or more. In addition, the thickness of the intermediate layer is preferably 15 μm or less and more preferably 8 μm or less. The thickness of the intermediate layer can be measured by the method described later in examples.

Hereinafter, components contained in the intermediate layer will be described in detail.

<Hydrophilic Resin (A)>

The hydrophilic resin generally refers to a water-soluble polymer having a water-soluble polar group.

The water-soluble polar group includes an amino group, an imino group, a tertiary amine group, a quaternary ammonium salt group, a hydrazide group, a carboxy group, a sulfonyl group, a sulfate group, a phosphate group, an ether group, a hydroxy group, and an amido group. Especially, the hydrophilic resin (A) in the intermediate layer of the flexographic printing raw plate of the present embodiment preferably includes a functional group enabling formation of a covalent bond and/or an ion bond with a clay mineral. Specific examples of such a functional group include a hydroxy group, which enables formation of a siloxane bond with a clay mineral, and an amino group, imino group, tertiary amine group, and quaternary ammonium salt group, which enable formation of an ion bond with a clay mineral.

Such functional groups can react selectively when the layered inorganic compound (B) described later is a delaminated clay mineral. Specifically, as the surface of a delaminated clay mineral has a silanol group (SiOH), the delaminated clay mineral is effectively and easily bonded by forming a siloxane bond (Si—O—Si). Furthermore, as the surface of a delaminated clay mineral has negative charge, an ion bond with quaternary ammonium ion (cation) is easily formed.

Specifically, the hydrophilic resin (A) includes a water-soluble poly(ethylene-vinyl alcohol) copolymer, a polyvinyl alcohol, a partially saponified polyvinyl acetate, a partially saponified poly(ethylene oxide vinyl acetate) graft copolymer, a polyvinyl butyral, a polyvinyl pyrrolidone, a polyurethane, a polyester, a polyether, cellulose, a polyamide, and a water-soluble phenol.

These may be used singly, or two or more thereof may be used in combination.

<Layered Inorganic Compound (B)>

The "layered inorganic compound" refers to an inorganic compound in which unit crystal layers are stacked to form layered particle.

A compound which swells and/or is cleaved in water is preferable as the layered inorganic compound (B), and examples thereof include a clay compound having water swellability. In addition, a compound containing aluminum hydroxide, barium sulfate, or potassium titanate dispersed in water is exemplified. Among these compounds, a clay compound having water swellability and a compound containing aluminum hydroxide dispersed in water are especially preferable.

In such a clay compound, usually, a layer in which $Si^{4+}$ coordinates with $O^{2-}$ to configure tetrahedral structure and a layer in which $Al^{3+}$, $Mg^{2+}$, $Fe^{2+}$, $Fe^{3+}$, or the like coordinates with $O^{2-}$ and $OH^-$ to configure octahedral structure are bonded in a ratio of 1:1 or 2:1 to be stacked one on top of another to thereby form layered structure. This clay compound may be a natural compound or may be a synthesized compound.

Aluminum hydroxide dispersed in water is in a state of fine particles dispersed in a solution. This may be a compound used in a sol state obtained by subjecting various forms of hydrated aluminum hydroxide (amorphous aluminum hydroxide, gibbsite, bayerite, boehmite, and diaspore) to hydrolysis and dehydration polycondensation in a solution to disperse a metal oxide or metal hydroxide, or may be a compound obtained by dispersing, in water, a product manufactured by a hydrothermal method in which aluminum hydroxide is reacted with water under high temperature and high pressure conditions.

The layered inorganic compound (B) is preferably a water-swellable clay mineral swelling or dissociating in layer form in water and is more preferably one capable of being dispersed in water in the form of a single layer or multiple layers, in view of compatibility with the hydrophilic resin (A) and the above-described cleanability.

Examples of preferable clay minerals include layered silicate minerals such as kaolinite, dickite, halloysite, talc, pyrophyllite, saponite, hectorite, montmorillonite, beidellite, vermiculite, mica, and palagonite.

Mica is especially preferable as the layered inorganic compound (B) for the following reason. Because mica has a high aspect ratio compared with other layered inorganic compounds, labyrinth effect is more effectively exerted, and thus the oxygen blocking property of the intermediate layer formed together with the hydrophilic resin (A) is especially high. Water-swellable synthetic mica is more preferable for the following reason. Because it has narrow average particle diameter distribution, an intermediate film in which the layered inorganic compound is uniformly dispersed is given, which has high cleanability.

The size of the layered inorganic compound (B) is preferably a size such that the layered inorganic compound (B) is uniformly arranged in the intermediate layer formed together with the hydrophilic resin (A) used in combination to thereby exert labyrinth effect effectively and thus highly develops the oxygen blocking property of the intermediate layer. From such viewpoints, the layered inorganic compound (B) preferably has an average particle diameter of 10 μm or less and a thickness of 500 nm or less and more preferably has an average particle diameter of 10 μm or less and a thickness of 100 nm or less.

When the average particle diameter is 1 μm or more, a sufficient oxygen blocking property can be exerted in the intermediate layer. When the average particle diameter is 10 μm or less, generation of appearance unevenness can be prevented.

When the thickness is 10 nm or more, the shape of particles can be maintained, which is preferable in practical use. When the thickness is 500 nm or less, uniform coating is possible, and a sufficient oxygen blocking property can be exerted.

Examples of commercially available products of the layered inorganic compound (B) include Micromica (synthetic mica) and Somasif (registered trade mark of Katakura & Co-op Agri Corporation, synthetic mica), KUNIPIA manufactured by KUNIMINE INDUSTRIES CO., LTD. (registered trade mark of KUNIMINE INDUSTRIES CO., LTD., montmorillonite), SUMECTON (registered trade mark of KUNIMINE INDUSTRIES CO., LTD.) SA (synthetic saponite); Bengel (registered trade mark of HOJUN Co., Ltd., purified product of natural bentonite) manufactured by HOJUN Co., Ltd., alumina sol F-1000, F-3000, 5N manufactured by Kawaken Fine Chemicals Co., Ltd., flake alumina powder Serath 00610, 02025, 02050, 05025, 05070, 07070, and 10030 manufactured by KINSEI MATEC CO., LTD., and TISMO D and TISMO N manufactured by Otsuka Chemical Co., Ltd.

<Water-Dispersible Latex (C)>

In the flexographic printing raw plate of the present embodiment, it is preferable that the intermediate layer further include a water-dispersible latex (C) in view of improving water developability of the intermediate layer.

Any water-dispersible latex can be used as the water-dispersible latex (C) as long as it can be homogeneously mixed with the hydrophilic resin (A). Examples thereof include, but not limited to, a water-dispersible latex polymer, such as polybutadiene latex, natural rubber latex, styrene-butadiene copolymer latex, acrylonitrile-butadiene copolymer latex, polychloroprene latex, polyisoprene latex, polyurethane latex, methacrylate methyl-butadiene copolymer latex, vinylpyridine polymer latex, butyl polymer latex, Thiokol polymer latex, and acrylate polymer latex; and a latex copolymer in which another component such as acrylic acid and methacrylic acid is copolymerized with these polymers.

Especially, preferred is a water-soluble or water-dispersible latex copolymer having a polar group including a hydrophilic group such as a carboxy group, an amino group, a hydroxy group, a phosphoric acid group, and a sulfonic acid group and a salt thereof.

In view of obtaining high cleanability in a manufacturing process of a flexographic printing plate using the flexographic printing raw plate of the present embodiment, a carboxy group- or hydroxy group-containing butadiene latex is preferable as the above-described latex polymer having a polar group.

These latex polymers having a polar group may be used singly, or two or more thereof may be combined.

The content of the water-dispersible latex (C) in the intermediate layer of the flexographic printing raw plate of the present embodiment is preferably 10% by mass or more, more preferably 20% by mass or more, and still more preferably 25% by mass or more based on the total amount of the intermediate layer in view of cleanability during a manufacturing process of a printing plate.

The content is preferably 80% by mass or less, more preferably 60% by mass or less, and still more preferably 50% by mass or less.

When the content of the water-dispersible latex (C) in the intermediate layer is 10% by mass or more, sufficient cleanability is provided, and when the content is 80% by mass or less, sufficient film strength is provided to obtain a flexographic printing plate with less tackiness.

The content of the water-dispersible latex (C) is preferably 5 parts by mass or more and 45 parts by mass or less per 100 parts by mass of the hydrophilic resin (A) in the intermediate layer. The content is preferably 5 parts by mass or more and more preferably 10 parts by mass or more in view of obtaining sufficient cleanability.

Furthermore, the content is preferably 45 parts by mass or less and more preferably 20 parts by mass or less in view of exerting a sufficient oxygen barrier property and improving reproducibility of a small dot printed matter.

The gel fraction of the intermediate layer is preferably 10% or more and 90% or less. The gel fraction can be calculated according to the following equation.

Gel fraction (%)=(mass of intermediate layer having been immersed in pure water at room temperature for 72 hours followed by drying at 50° C. for three hours/mass of intermediate layer before being immersed in pure water)×100

The gel fraction is preferably 10% or more, more preferably 30% or more, still more preferably 60% or more, and further preferably 70% or more in view of water resistance of the intermediate layer. In addition, the gel fraction is preferably 90% or less, more preferably 80% or less, and still more preferably 70% or less in view of cleanability.

The gel fraction can be measured by the method described later in examples.

The gel fraction is a measure of crosslinking degree of intermediate layer components. As the value thereof is larger, the water resistance is higher, which tends to result in the smaller number of defects in evaluation for pin hole after storage under a high humidity. As the value of the gel fraction is smaller, the water resistance is lower, which tends to result in the larger number of defects in evaluation for pin hole after storage under a high humidity. The gel fraction can be controlled by adjusting the aspect ratio of the layered inorganic compound (B), the number of functional groups of the hydrophilic resin (A), or the glass transition temperature (Tg) of the water-dispersible latex (C). When the values of the aspect ratio, the number of functional groups of the hydrophilic resin (A), and the glass transition temperature of the water-dispersible latex (C) increase, the gel fraction value tends to increase.

In addition, a silicone compound or a surfactant may be included in the intermediate layer in view of improving film thickness uniformity at the time of coating the intermediate layer.

<Silicone Compound>

The intermediate layer can be formed by applying a material for forming the intermediate layer on an infrared ablation layer, for example. For the purpose of uniformly applying the intermediate layer onto the above-described infrared ablation layer, the intermediate layer preferably contains a silicone compound or a surfactant in view of controlling surface energy.

The molecular structure of the silicone compound is not particularly limited, and preferable compounds therefor include a compound having a polyalkylsiloxane such as polydimethylsiloxane or polydiethylsiloxane in its main chain. The silicone compound may be a compound having polysiloxane structure at a part of its molecular. A compound in which a certain organic group is introduced into polysiloxane structure can also be used. Specifically, a compound in which an organic group is introduced into a side chain of polysiloxane, a compound in which an organic group is introduced into both terminals of polysiloxane, a compound in which an organic group is introduced into one terminal of polysiloxane, a compound in which an organic group is introduced into both of a side chain and a terminal of polysiloxane, and the like can be used.

A silicone compound into which an organic group is introduced is preferably used in view of ensuring adhesiveness between the intermediate layer and the photosensitive resin composition layer.

Examples of the organic group to be introduced into polysiloxane structure include, but not limited to, an amino group, a carboxy group, a carbinol group, an aryl group, an alkyl group, an alkoxycarbonyl group, an alkoxy group, a linear or branched alkyl group substituted with at least one aryl group, and a polyoxyalkylene group (hereinafter also referred to as a polyether group).

Examples of the silicone compound to be used include, but not limited to, various kinds of organic group-substituted silicone oil manufactured by Shin-Etsu Chemical Co., Ltd., Wacker Asahikasei Silicone Co., Ltd., GE Toshiba Silicones Co., Ltd., and Dow Corning Toray Silicone Co., Ltd.

The silicone compound is preferably contained in an amount of 0.01% by mass or more and 1.0% by mass or less, more preferably contained in an amount of 0.05% by mass or more and 0.5% by mass or less, and still more preferably contained in an amount of 0.05% by mass or more and 0.3% by mass or less based on 100% by mass of the total amount of the material forming the intermediate layer.

<Surfactant>

Examples of the surfactant include an anionic surfactant, an ionic surfactant, a nonionic surfactant, a reactive anionic surfactant, and a reactive nonionic surfactant.

Examples of the surfactant include, but not limited to, anionic surfactants such as a sodium polyoxyethylene styrenated phenyl ether sulfate, a sodium polyoxyalkylene branched decyl ether sulfate, an ammonium polyoxyethylene isodecyl ether sulfate, a sodium polyoxyethylene tridecyl ether sulfate, a sodium polyoxyethylene alkyl (C8-C20) ether sulfate, an ammonium polyoxyethylene oleyl cetyl ether sulfate, a sodium polyoxyethylene oleyl cetyl ether sulfate, a polyoxyethylene tridecyl ether phosphate, a polyoxyethylene alkyl (C2-C16) ether phosphate, a polyoxyethylene alkyl (C2-C16) ether phosphate-monoethanolamine salt, a sodium alkyl (C2-C16) phosphate, an alkyl (C2-C16) phosphate-monoethanolamine salt, disodium lauryl sulfosuccinate, a disodium lauryl polyoxyethylene sulfosuccinate, a disodium polyoxyethylene alkyl (C2-C20) sulfosuccinate, a sodium linear alkylbenzene sulfonate, a linear alkylbenzene sulfonate, a sodium alpha-olefin sulfonate, phenolsulfonic acid, sodium dioctyl sulfosuccinate, sodium lauryl sulfate, and a higher fatty acid potassium salt;

ionic surfactants such as an alkyl (C8-C20) trimethylammonium chloride, an alkyl (C8-C20) dimethylethylammonium chloride, didecyldimethylammonium chloride, lauryl dimethyl benzyl ammonium chloride, stearyl dimethyl hydroxyethyl ammonium para-toluene sulfonate, stearyl dimethyl aminopropylamide, tributyl benzyl ammonium chloride, lauryl dimethyl aminoacetic acid betaine, laurylamide propyl betaine, cocamidepropyl betaine, octanamide propyl betaine, and lauryl dimethyl amine oxide; and nonionic surfactants such as a polyoxyalkylene tridecyl ether, a polyoxyethylene isodecyl ether, a polyoxyalkylene lauryl ether, a polyoxyalkylene alkyl ether, a mixture of a polyoxyalkylene ether and a polyether polyol, a polyether polyol, a polyoxyethylene sulfonated phenyl ether, a polyoxyethylene naphthyl ether, phenoxyethanol, a polyoxyethylene phenyl ether, a polyoxyethylene polyoxypropylene glycol, a polyoxyethylene lauryl ether, a polyoxyethylene oleyl cetyl ether, a polyoxyethylene oleate, a polyoxyethylene distearate, a polyoxyethylene glyceryl isostearate, polyoxyethylene-cured castor oil, coconut fatty acid diethanolamide, polyoxyethylene alkylamine, sorbitan trioleate, sorbitan sesquioleate, sorbitan monooleate, sorbitan monococoate, sorbitan monocaprylate, a polyoxyethylene sorbitan monococoate, a polyoxyethylene sorbitan monostearate, a polyoxyethylene sorbitan monooleate, octyl polyglycoside, a butyl polyglycoside, sucrose benzoate, sucrose acetate, and a sucrose fatty acid ester; anionic reactive surfactants such as an ammonium polyoxyethylene-1-(allyloxymethyl)alkyl ether sulfate and an ammonium polyoxyethylene nonyl propenyl phenyl ether sulfate; and nonionic reactive surfactants such as a polyoxyethylene nonyl propenyl phenyl ether.

The above-described surfactants may be used singly, or two or more thereof may be combined.

The surfactant may be added to another layer (for example, the photosensitive resin composition layer) in addition to the intermediate layer, and is preferably contained in an amount of 0.1% by mass or more and 5.0% by mass or less, more preferably contained in an amount of 0.5% by mass or more and 3.0% by mass or less, and still more preferably contained in an amount of 0.5% by mass or more and 2.0% by mass or less based on 100% by mass of the total amount of material for a layer to which the surfactant is added.

When 0.1% by mass or more of the surfactant is contained, cleaning speed at the time of development after exposure can be improved. When 5.0% by mass or less of the surfactant is contained, swelling of the flexographic printing raw plate tends to be suppressed.

(Infrared Ablation Layer)

The flexographic printing raw plate of the present embodiment has an infrared ablation layer above the photosensitive resin composition layer with the intermediate layer interposed therebetween.

The infrared ablation layer can be subjected to lithography processing using infrared light and serves as a mask image when the photosensitive resin composition layer is exposed and cured. At the time when an unexposed part of the photosensitive resin composition layer is washed out after completion of the exposure, this infrared ablation layer is simultaneously removed.

The infrared ablation layer is preferably composed of a binder polymer and an infrared sensitive substance.

Examples of the binder polymer include a polyamide, a polyester, and a copolymer of a monovinyl-substituted aromatic hydrocarbon and a conjugated diene.

Especially, a copolymer of a monovinyl-substituted aromatic hydrocarbon such as styrene, α-methyl styrene, and vinyltoluene and a conjugated diene such as 1,3-butadiene and isoprene are preferable.

When the infrared ablation layer includes the above-described binder polymer, compatibility with the photosensitive composition resin layer is higher, and adhesion is thus better.

When a polyester is used as the binder polymer, a number average molecular weight thereof is preferably 300 or more and 10,000 or less.

The polyester is not limited, and preferable examples thereof include a polyester synthesized from an alkanediol and adipic acid, a polyester synthesized from an alkanediol and phthalic acid, a polycaprolactone, and a combination of two or more of these polyesters.

In addition, the polyester may include various functional groups such as an amino group, a nitro group, a sulfonic acid group, and a halogen as long as they do not impair compatibility with another binder polymer, the infrared sensitive substance, and a non-infrared radiation shielding substance.

The infrared sensitive substance is not limited, and a simple substance or compound having strong absorption in a range of usually 750 to 2000 nm is preferably used, for example.

Examples of the infrared sensitive substance include, but not limited to, inorganic pigments such as carbon black, graphite, copper chromite, and chromium oxide; and colorants such as a polyphthalocyanine compound, cyanine colorant, and metal thiolate colorant.

These infrared sensitive substances are added in an amount such that sensitiveness for ablation with a laser beam used is imparted. Generally, addition in an amount of 10% to 80% by mass is effective.

A substance reflecting or absorbing radial rays such as ultraviolet light can be used as the infrared sensitive substance. A radiation absorber such as an ultraviolet absorber, carbon black, and graphite are preferable examples thereof, and the amount thereof added is set so as to achieve a required optical density. It is usually preferable that the infrared sensitive substance be added so as to achieve an optical density of two or more and preferably three or more.

[Manufacturing Method of Flexographic Printing Raw Plate]

A flexographic printing raw plate can be manufactured by stacking the photosensitive resin composition layer, the intermediate layer, and the infrared ablation layer on the support.

The manufacturing method of the flexographic printing raw plate of the present embodiment is not particularly limited and can be carried out by various manners. The following method is exemplified as a specific example.

First, the photosensitive resin composition layer is obtained by a method involving dissolving starting materials for the photosensitive resin composition, which is a material of the photosensitive resin composition layer, in an appropriate solvent (for example, a solvent such as chloroform, tetrachloroethylene, methyl ethyl ketone, or toluene) followed by mixing, casting the resultant composition in a mold flame, and evaporating the solvent to make into a plate-like shape; alternatively, the photosensitive resin composition layer is obtained by a method involving kneading the starting materials using a kneader, a roll mill, or a screw extruder without a solvent and subsequently molding the kneaded product using a calendering roll, press, or the like to have a desired thickness. The photosensitive resin composition layer thus obtained and the support are laminated to obtain a stack of the support and the photosensitive resin composition layer.

Next, the intermediate layer and the infrared ablation layer are formed on the photosensitive resin composition layer.

In order to provide the intermediate layer and the infrared ablation layer on the surface of the photosensitive resin composition layer, for example, a predetermined dispersion or solution is obtained by dispersing or dissolving components for the intermediate layer or components for the infrared ablation layer in an appropriate solvent by forced stirring using a stirring blade or ultrasonic stirring, or dispersing or dissolving the components in an appropriate solvent after prekneading using an extruder or kneader; and subsequently, the photosensitive resin composition layer is directly coated with the dispersion or solution to form the intermediate layer or the infrared ablation layer.

In addition, a cover sheet of, for example, polyester, polypropylene, or the like may be provided on the infrared ablation layer.

Another method is as follows: a film having the infrared ablation layer is obtained by coating a predetermined cover sheet with a material for the infrared ablation layer; a cover film on which the infrared ablation layer and the intermediate layer are stacked is subsequently obtained by coating the infrared ablation layer with a material for the intermediate layer; and subsequently this cover film is laminated on or press-bonded to the photosensitive resin composition layer side of a stack including the support and the photosensitive resin composition layer, thereby forming the intermediate layer and the infrared ablation layer on the photosensitive resin composition layer.

After forming the sheet of the photosensitive resin composition layer, the cover film or support can usually be closely adhere to the photosensitive resin composition layer by roll lamination and heat-pressed after lamination, thereby obtaining a flexographic printing raw plate with still better thickness accuracy.

[Manufacturing Method of Flexographic Printing Plate]

A method of making a flexographic printing plate from the flexographic printing raw plate includes the following method, for example.

First, the entire surface of the photosensitive resin composition layer is subjected to ultraviolet light exposure (back exposure) through the support of the flexographic printing raw plate and cured to form a thin uniform cured layer.

Next, a negative pattern is created on the infrared ablation layer on the photosensitive resin composition layer by laser lithography (i.e. laser ablation), and image exposure (relief exposure) is then directly conducted on the face of the photosensitive resin composition layer from above the infrared ablation layer on which the negative pattern is formed.

Thereafter, an unexposed part is washed away with a solvent-based developer or an aqueous developer. Alternatively, an unexposed part heated to 40° C. to 200° C. is brought into contact with an absorption layer capable of absorbing the unexposed part and the unexposed part is removed by removing the absorption layer.

Further, post treatment exposure is conducted to obtain a flexographic printing plate.

Either exposure from the infrared ablation layer side (relief exposure) or exposure from the support film side (back exposure) may be conducted first, or both may be simultaneously conducted. Examples of an exposure light source include a high pressure mercury lamp, an ultraviolet fluorescent lamp, a carbon arc lamp, and a xenon lamp.

An infrared laser can be used for laser lithography, and a laser with a wavelength of 750 to 2000 nm is preferable as the infrared laser. A semiconductor laser with a wavelength of 750 to 880 nm and Nd-YAG laser with a wavelength of 1060 nm are generally used as the infrared laser satisfying said wavelength range.

For developing the unexposed part of the photosensitive resin composition layer with a solvent-based developer, preferable examples of the solvent-based developer include esters such as heptylacetate and 3-methoxybutyl acetate; hydrocarbons such as a petroleum fraction, toluene, and decalin; a mixture of alcohols such as propanol, butanol, and pentanol with a chlorine-based organic solvent such as tetrachloroethylene; water; and ethers such as a polyoxyalkylene alkyl ether.

Washout of the unexposed part can be carried out by spraying from a nozzle and/or brushing with a brush.

When the unexposed part of the photosensitive resin composition layer is developed with an aqueous developer, the aqueous developer is a developer containing water as a main component. The aqueous developer may be water itself or may be a mixture of water with a surfactant such as a nonionic surfactant and an anionic surfactant, a pH adjuster, a cleaning accelerator, and the like, for example.

Examples of the nonionic surfactant include, but not limited to, a polyoxyalkylenealkyl or alkenyl ether, a polyoxyalkylenealkyl or alkenyl phenyl ether, a polyoxyalkylenealkyl or alkenyl amine, a polyoxyalkylenealkyl or alkenyl amide, and an ethylene oxide/propylene oxide block-addition product.

Examples of the anionic surfactant include, but not limited to, a linear alkylbenzene sulfonate having an alkyl having 8 to 16 carbon atoms on average, an α-olefin sulfonate having 10 to 20 carbon atoms on average, a dialkyl sulfosuccinate in which the alkyl group or alkenyl group thereof has 4 to 10 carbon atoms, a sulfonate of a fatty acid lower alkyl ester, an alkyl sulfate having 10 to 20 carbon atoms on average, an alkyl ether sulfate which has a linear or branched alkyl or alkenyl group having 10 to 20 carbon atoms on average and to which ethylene oxide is added in an average amount of 0.5 to 8 moles, and a saturated or unsaturated fatty acid salt having 10 to 22 carbon atoms on average.

Examples of the pH adjuster include, but not limited to, sodium borate, sodium carbonate, sodium silicate, sodium metasilicate, sodium succinate, and sodium acetate. Among them, sodium silicate is preferable since sodium silicate is easily dissolved in water.

The cleaning accelerator described above enhances cleaning (developing) performance of a developer when the cleaning accelerator is used in combination with the surfactant and pH adjuster described above.

Examples of the cleaning accelerator include, but not limited to, amines such as monoethanolamine, diethanolamine, and triethanolamine, ammonium salts such as tetramethylammonium hydroxide, and parafin-based hydrocarbons.

One or more selected from the group consisting of a surfactant such as a nonionic surfactant and an anionic surfactant, a pH adjuster, and a cleaning accelerator each can be added to and mixed with a developer in an amount within a range of preferably 0.1% to 50% by mass and more preferably 1% to 10% by mass.

In development, vibration may be additionally applied to the flexographic printing raw plate using ultrasonic waves or the like, or the surface of the printing raw plate may be additionally rubbed using mechanical means such as a brush.

It is preferable that a silicone compound be added to the solvent-based developer and aqueous developer in an amount of 0.01% by mass or more and 5% by mass or less in view of enabling bright printing and obtaining a flexographic printing plate excellent in ink adhesion and ink transfer properties.

That is, the flexographic printing plate of the present embodiment is preferably a flexographic printing plate obtained through development with a developer containing a silicone compound in an amount of 0.01% by mass or more and 5% by mass or less at the time of development after forming a pattern on the flexographic printing raw plate and exposing the flexographic printing raw plate.

Examples of the silicone compound include, but not limited to, silicone oil including a siloxane unit (hereinafter simply referred to as silicone oil), a silane coupling agent, a silane compound, silicone rubber, and silicone resin.

Among the silicone compounds described above, silicone oil modified by an amino group, a polyether group, a carbinol group, or the like is preferable as the silicone compound to be contained in a developer.

As a post treatment exposure, a method involving irradiating the surface with light having a wavelength of 300 nm or less is exemplified. Light having a wavelength of more than 300 nm may be used in combination as needed.

The photosensitive resin composition layer of the flexographic printing raw plate of the present embodiment is useful for both solvent development and heat development but is especially preferably used for solvent development in view of high image reproducibility of a printing plate.

In the manufacturing method of a flexographic printing plate of the present embodiment, it is preferable that a silicone component and/or a fluorine-based compound be applied to a flexographic printing plate after development and before post treatment exposure in view of enabling provision of bright printing and obtaining a flexographic printing plate excellent in ink adhesion and ink transfer properties.

That is, the flexographic printing plate of the present embodiment is preferably a flexographic printing plate obtained by applying a silicone component and/or a fluorine-based compound after the flexographic printing raw plate is subjected to pattern forming, exposure, and development.

The silicone component applied to the plate after development may be reactive silicone or may be non-reactive silicone, and preferable examples thereof include (meth) acrylic modified silicone.

Preferable examples of the fluorine-based compound applied after development include a polyethylene fluoride compound, a poly(ethylene-ethylene fluoride) compound, an acrylic copolymer having a perfluoroalkyl group in its side chain, a urethane-based polymer having a perfluoroalkyl group, and an ester-based polymer having a perfluoroalkyl group, or a fluorine-based monomer.

These silicone components and the fluorine-based compounds may be used singly, or two or more thereof may be used in combination.

The silicone component and/or fluorine-based compound described above is preferably dissolved in a solvent and used in the form of a solution.

A solvent capable of adhering the surface of a printing plate and penetrating into the vicinity of the surface is preferable as the solvent. By virtue of selecting a solvent capable of penetrating into the surface of a printing plate and thereafter subjecting the post exposure step, the silicone component and/or fluorine-based compound can be more firmly fixed to (the vicinity of) the plate surface.

A concentration of the silicone component and/or fluorine-based compound in the solution containing the silicone component and/or fluorine-based compound is preferably 0.05% to 50% by mass.

The above-described solvent is not limited, and a hydrocarbon, an acetate, an alcohol, a ketone, a glycol ether, or the like can be used as the solvent. These can be used singly, or two or more thereof can be used in combination.

In order to allow penetration into the surface of a printing plate, water and a paraffin or glycol ether as the above-described solvent can be used in combination, and a non-ionic surfactant having high penetration performance can be added.

An additive such as a defoaming agent, an antioxidizing agent, and an antiseptic agent, may be added to the solution containing the silicone component and/or fluorine-based compound as needed.

As an application method to the plate surface of the flexographic printing plate after development, application of solution with a spray, brush application, immersion, a method involving applying a solution with a cloth or sponge, and a method involving adding to a rinse agent and dropping on the plate surface after development are exemplified. Among them, application of solution with a spray is preferable.

Application may be carried out immediately after development or carried out after development and drying, as long as application is carried out before post exposure.

EXAMPLES

Hereinafter, the present invention will be described in detail with reference to specific working examples and comparative examples. However, the present invention is not limited to the following examples at all.

Manufacturing Example 1

(Synthesis of Hydrophilic Copolymer)

To a pressure resistant reaction vessel provided with a stirring device and a jacket for temperature adjustment were initially added 125 parts by mass of water and, as a reactive emulsifier, 2 parts by mass of "ADEKA REASOAP" (manufactured by ADEKA Corporation), an ammonium salt of (α-sulfo(1-nonylphenoxy)methyl-2-(2-propenyloxy) ethoxy-poly(oxy-1,2-ethanediyl). The inside temperature was increased to 80° C.; and an oil-based mixture liquid including 2 parts by mass of t-dodecyl mercaptan and a monomer mixture including 10 parts by mass of styrene, 60 parts by mass of butadiene, 23 parts by mass of butyl acrylate, 5 parts by mass of methacrylic acid, and 2 parts by mass of acrylic acid and an aqueous solution including 28 parts by mass of water, 1.2 parts by mass of sodium peroxodisulfate, and 0.2 parts by mass of sodium hydroxide, and 2 parts by mass of an ammonium salt of (α-sulfo(1-nonylphenoxy)methyl-2-(2-propenyloxy)ethoxy-poly(oxy-1,2-ethanediyl) were added to the reaction vessel over five hours and six hours, respectively, at a constant flow rate.

Thereafter, the temperature was continuously kept at 80° C. for one hour to complete polymerization reaction and obtain a copolymer latex, followed by cooling.

Furthermore, pH of the produced copolymer latex was adjusted to 7 by sodium hydroxide, unreacted monomers were then removed by a steam stripping method followed by filtration with a 200 mesh metallic mesh, and the solid concentration of the filtrate was finally adjusted to 40% by mass to obtain an aqueous dispersion of a hydrophilic copolymer.

The obtained aqueous dispersion of the hydrophilic copolymer was dried up by a vacuum dryer at 50° C. to consequently remove water therefrom to thereby obtain the hydrophilic copolymer.

Manufacturing Example 2

(Production of Base Film (Support))

As a solution for an adhesive layer to coat a support (base film), 55 parts by mass of Tufprene 912 (manufactured by Asahi Kasei Corp., trade name), which is a block copolymer of styrene and 1,3-butadiene, 38 parts by mass of paraffin oil (average carbon number: 33, average molecular weight: 470, and density at 15° C.: 0.868), 2.5 parts by mass of 1,9-nonanediol diacrylate, 1.5 parts by mass of 2,2-dimethoxy-phenylacetophenone, 3 parts by mass of EPDXY ESTER 3000M (manufactured by Kyoeisha Chemical Co., Ltd., trade name), and 1.5 parts by mass of VALIFAST YELLOW-3150 (manufactured by ORIENT CHEMICAL INDUSTRIES CO., LTD., trade name) were dissolved in toluene to obtain a solution with a solid content of 25%.

Thereafter, the obtained solution was applied to one side of a polyester film having a thickness of 100 μm using a knife coater so as to achieve an ultraviolet transmittance of 10% followed by drying at 80° C. for one minute to obtain a support (base film) having an adhesive layer.

The UV transmittance of the support was calculated from transmission intensity measured by UV illuminometer MO-2 model (manufactured by ORC MANUFACTURING CO., LTD., trade name, UV-35 filter) using ultraviolet light exposure apparatus AFP-1500 (manufactured by Asahi Kasei Corp., trade name).

Manufacturing Example 3

(Production of Film Having Infrared Ablation Layer)

After 65% by mass of Asaflex 810 (manufactured by Asahi Kasei Corp., trade name), which is a block copolymer of styrene and 1,3-butadiene, and 35% by mass of carbon black as an infrared sensitive substance were kneaded with a kneader and cut into a pellet, 90 parts by mass of this pellet and 10 parts by mass of 1,6-hexanediol adipate were dissolved, utilizing ultrasonic waves, in a solvent mixture prepared at a mass ratio of ethyl acetate/butyl acetate/propyleneglycol monomethyl ether acetate=50/30/20 to prepare a uniform solution with a solid content of 12% by mass.

Thereafter, this solution was applied onto a polyester film to be a cover sheet with a thickness of 100 μm to achieve an applied amount after drying of 4 to 5 g/m$^2$ using a knife coater followed by drying at 80° C. for one minute to obtain a film having an ultraviolet shielding layer (infrared ablation layer) capable of ablating by infrared light.

The optical density of the film having the infrared ablation layer measured by DM-500 (manufactured by Dainippon Screen Mfg. Co., Ltd., trade name) was 3 to 4.

Manufacturing Example 4

(Production of Cover Film (Film Having Intermediate Layer and Infrared Ablation Layer))

To a solution prepared at a mass ratio of ethanol/distilled water=10/90 were added 75% by mass of a water-soluble polyamide (PA, manufactured by Toray Industries, Inc., AQ Nylon T-70), 5% by mass of water-swellable synthetic mica (manufactured by Katakura & Co-op Agri Corporation, Somasif MEB-3 aqueous solution), 10% by mass of a water-dispersible latex (manufactured by Asahi Kasei Corp., L7430), and 10% by mass of modified silicone oil (manufactured by Shin-Etsu Chemical Co., Ltd., KF-351A) followed by stirring to prepare an intermediate layer coating liquid.

Thereafter, the intermediate layer coating liquid was applied onto the film having the infrared ablation layer produced in [Manufacturing Example 3] described above at the side on which the infrared ablation layer was formed so that the thickness after drying became 3 μm using a bar coater.

A cover film having an intermediate layer and the infrared ablation layer was obtained by subsequent drying at 100° C. for four minutes.

Example 1

(Production of Flexographic Printing Raw Plate)

After mixing 32 parts by mass of the hydrophilic copolymer obtained in [Manufacturing Example 1] described above and 28 parts by mass of a styrene-butadiene-styrene copolymer [D-KX405: manufactured by Kraton Corporation] at 140° C. using a pressure kneader, a liquid mixture of 32 parts by mass of a liquid polybutadiene [LBR-352: manufactured by Kuraray Co., Ltd.], 8 parts by mass of 1,9-nonanediol diacrylate, 5 parts by mass of 1,6-hexanediol dimethacrylate, 2 parts by mass of 2,2-dimethoxy-phenylacetophenone, 1 part by mass of 2,6-di-t-butyl-p-cresol, and 1 part by mass of carbinol-modified silicone oil [KF-6000: manufactured by Shin-Etsu Chemical Co., Ltd.] was added little by little over 15 minutes, and additional kneading was carried out for 20 minutes after completion of addition to obtain a photosensitive resin composition.

Thereafter, the photosensitive resin composition was put into an extrusion molding machine, the base film (support) obtained in [Manufacturing Example 2] described above was laminated on one face of the photosensitive resin composition layer extruded from a T-shaped die and molded, a mold release film (manufactured by Mitsubishi Chemical Corporation, DIAFOIL MRV100) was further laminated on the face of the photosensitive resin composition layer opposed to the side on which the support was laminated to obtain a stack of the support and the photosensitive resin composition layer.

Thereafter, the mold release film was peeled, and the cover film having the intermediate layer and the infrared ablation layer obtained in [Manufacturing Example 4] described above were laminated so that the intermediate layer contacted the photosensitive resin composition layer to obtain a flexographic printing raw plate.
(Manufacturing of Flexographic Printing Plate)

The flexographic printing raw plate described above was exposed from the side of the support (PET coated with an adhesive) using an ultraviolet light exposure apparatus (JE-A2-SS manufactured by Nihon Denshi Seiki Co., Ltd.) so that a pattern height (RD) after curing was about 0.6 mm.

Thereafter, the cover sheet of the infrared ablation layer was peeled, a halftone image (AM 150 lpi, data 1% halftone) was drawn on the infrared ablation layer using a laser ablation device (CDI) manufactured by ESKO, and the infrared ablation layer side was exposed at 8000 mJ under an air atmosphere using the above-described exposure apparatus.

After exposure, an aqueous solution (aqueous developer) containing 1% of a polyoxyalkylene alkyl ether (Newcol 2308: manufactured by Nippon Nyukazai Co., Ltd.) and 1% of potassium carbonate was prepared, and the unexposed part was removed by washing (development) at 40° C. using a washing machine (JOW-A3-P) manufactured by Nihon Denshi Seiki Co., Ltd.

After drying at 50° C. for ten minutes, postexposure was conducted with an ultraviolet sterilization lamp and an ultraviolet chemical lamp so as to remove tackiness on the surface, and a flexographic printing plate was obtained thereby.

Example 2

Sodium carboxymethyl cellulose (CMC manufactured by Wako Pure Chemical Industries, Ltd.) was used instead of the water-soluble polyamide (PA) at the time of preparing the intermediate layer coating liquid described in [Manufacturing Example 4] in manufacturing the flexographic printing plate. Except for this, the same conditions as in [Example 1] were applied to obtain a flexographic printing raw plate and a flexographic printing plate.

Example 3

A polyvinyl alcohol (PVA manufactured by Kuraray Co., Ltd., POVAL PVA-205) was used instead of the water-soluble polyamide (PA) at the time of preparing the intermediate layer coating liquid described in [Manufacturing Example 4] in manufacturing the flexographic printing plate. Except for this, the same conditions as in [Example 1] were applied to obtain a flexographic printing raw plate and a flexographic printing plate.

Example 4

A water-soluble polyurethane (PU manufactured by DIC Corporation, HYDRAN WLS-202) was used instead of the water-soluble polyamide (PA) at the time of preparing the intermediate layer coating liquid described in [Manufacturing Example 4] in manufacturing the flexographic printing plate. Except for this, the same conditions as in [Example 1] were applied to obtain a flexographic printing raw plate and a flexographic printing plate.

Example 5

At the time of preparing the intermediate layer coating liquid described in [Manufacturing Example 4] in manufacturing the flexographic printing plate, 55% by mass of a water-soluble polyamide (PA, manufactured by Toray Industries, Inc., AQ Nylon T-70), 10% by mass of water-swellable synthetic mica (manufactured by Katakura & Co-op Agri Corporation, Somasif MEB-3 aqueous solution), 10% by mass of a water-dispersible latex (manufactured by Asahi Kasei Corp., L7430), and 10% by mass of modified silicone oil (manufactured by Shin-Etsu Chemical Co., Ltd., KF-351A) were used. Except for this, the same conditions as in [Example 1] described above were applied to obtain a flexographic printing raw plate and a flexographic printing plate.

Example 6

At the time of preparing the intermediate layer coating liquid described in [Manufacturing Example 4] in manufacturing the flexographic printing plate, 70% by mass of a water-soluble polyamide (PA, manufactured by Toray Industries, Inc., AQ Nylon T-70) and 10% by mass of water-swellable synthetic mica (manufactured by Katakura & Co-op Agri Corporation, Somasif MEB-3 aqueous solution) were used. Except for this, the same conditions as in [Example 1] described above were applied to obtain a flexographic printing raw plate and a flexographic printing plate.

Example 7

At the time of preparing the intermediate layer coating liquid described in [Manufacturing Example 4] in manufacturing the flexographic printing plate, 79% by mass of a water-soluble polyamide (PA, manufactured by Toray Industries, Inc., AQ Nylon T-70) and 1% by mass of water-swellable synthetic mica (manufactured by Katakura & Co-op Agri Corporation, Somasif MEB-3 aqueous solution) were used. Except for this, the same conditions as in [Example 1] described above were applied to obtain a flexographic printing raw plate and a flexographic printing plate.

Example 8

Water-swellable synthetic mica (manufactured by Katakura & Co-op Agri Corporation, Somasif ME-100) was used instead of the water-swellable synthetic mica (manufactured by Katakura & Co-op Agri Corporation, Somasif MEB-3 aqueous solution) at the time of preparing the intermediate layer coating liquid described in [Manufacturing Example 4] in manufacturing the flexographic printing plate. Except for this, the same conditions as in [Example 1] described above were applied to obtain a flexographic printing raw plate and a flexographic printing plate.

Example 9

Montmorillonite (KUNIMINE INDUSTRIES CO., LTD., KUNIPIA) was used instead of the water-swellable synthetic mica (manufactured by Katakura & Co-op Agri Corporation, Somasif MEB-3 aqueous solution) at the time of preparing the intermediate layer coating liquid described in [Manufacturing Example 4] in manufacturing the flexographic printing plate. Except for this, the same conditions as in [Example 1] described above were applied to obtain a flexographic printing raw plate and a flexographic printing plate.

Example 10

Montmorillonite (KUNIMINE INDUSTRIES CO., LTD., SUMECTON) was used instead of the water-swellable synthetic mica (manufactured by Katakura & Co-op Agri Corporation, Somasif MEB-3 aqueous solution) at the time of preparing the intermediate layer coating liquid described in [Manufacturing Example 4] in manufacturing the flexographic printing plate. Except for this, the same conditions as in [Example 1] described above were applied to obtain a flexographic printing raw plate and a flexographic printing plate.

Example 11

At the time of preparing the intermediate layer coating liquid described in [Manufacturing Example 4] in manufacturing the flexographic printing plate, application was carried out with the intermediate layer coating liquid adjusted so that the thickness of the intermediate layer was 2.0 μm. Except for this, the same conditions as in [Example 1] described above were applied to obtain a flexographic printing raw plate and a flexographic printing plate.

Example 12

At the time of preparing the intermediate layer coating liquid described in [Manufacturing Example 4] in manufacturing the flexographic printing plate, application was carried out with the intermediate layer coating liquid adjusted so that the thickness of the intermediate layer was 10 μm. Except for this, the same conditions as in [Example 1] describe above were applied to obtain a flexographic printing raw plate and a flexographic printing plate.

Example 13

At the time of preparing the intermediate layer coating liquid described in [Manufacturing Example 4] in manufacturing the flexographic printing plate, application was carried out with the intermediate layer coating liquid adjusted so that the thickness of the intermediate layer was 30 μm. Except for this, the same conditions as in [Example 1] describe above were applied to obtain a flexographic printing raw plate and a flexographic printing plate.

Example 14

At the time of preparing the intermediate layer coating liquid described in [Manufacturing Example 4] in manufacturing the flexographic printing plate, 60% by mass of a water-soluble polyamide (PA, manufactured by Toray Industries, Inc., AQ Nylon T-70) and 25% by mass of a water-dispersible latex (manufactured by Asahi Kasei Corp., L7430) were used. Except for this, the same conditions as in [Example 1] described above were applied to obtain a flexographic printing raw plate and a flexographic printing plate.

Example 15

At the time of preparing the intermediate layer coating liquid described in [Manufacturing Example 4] in manufacturing the flexographic printing plate, 80% by mass of a water-soluble polyamide (PA, manufactured by Toray Industries, Inc., AQ Nylon T-70) and 5% by mass of a water-dispersible latex (manufactured by Asahi Kasei Corp., L7430) were used. Except for this, the same conditions as in [Example 1] described above were applied to obtain a flexographic printing raw plate and a flexographic printing plate.

Example 16

At the time of preparing the intermediate layer coating liquid described in [Manufacturing Example 4] in manufacturing the flexographic printing plate, 75% by mass of a water-soluble polyamide (PA, manufactured by Toray Industries, Inc., AQ Nylon T-70) and 10% by mass of a water-dispersible latex (manufactured by Asahi Kasei Corp., XL-006) were used. Except for this, the same conditions as in [Example 1] described above were applied to obtain a flexographic printing raw plate and a flexographic printing plate.

Example 17

At the time of preparing the intermediate layer coating liquid described in [Manufacturing Example 4] in manufacturing the flexographic printing plate, 85% by mass of a water-soluble polyamide (PA, manufactured by Toray Industries, Inc., AQ Nylon T-70), 5% by mass of water-swellable synthetic mica (manufactured by Katakura & Co-op Agri Corporation, Somasif MEB-3 aqueous solution), and 10% by mass of modified silicone oil (manufactured by Shin-Etsu Chemical Co., Ltd., KF-351A) were used.

The water-dispersible latex (manufactured by Asahi Kasei Corp., L7430) was not used.

Except for the above, the same conditions as in [Example 1] described above were applied to obtain a flexographic printing raw plate and a flexographic printing plate.

Example 18

At the time of preparing the intermediate layer coating liquid described in [Manufacturing Example 4] in manufacturing the flexographic printing plate, 75% by mass of a water-soluble polyamide (PA, manufactured by Toray Industries, Inc., AQ Nylon T-70), 5% by mass of water-swellable synthetic mica (manufactured by Katakura & Co-op Agri Corporation, Somasif MEB-3 aqueous solution), 8% by mass of a water-dispersible latex (manufactured by Zeon Corporation, Nipol SX1503A), and 10% by mass of modified silicone oil (manufactured by Shin-Etsu Chemical Co., Ltd., KF-351A) were used.

Except for this, the same conditions as in [Example 1] described above were applied to obtain a flexographic printing raw plate and a flexographic printing plate.

Example 19

At the time of preparing the intermediate layer coating liquid described in [Manufacturing Example 4] in manufacturing the flexographic printing plate, 75% by mass of a water-soluble polyamide (PA, manufactured by Toray Industries, Inc., AQ Nylon T-70), 5% by mass of boehmite (manufactured by Kawaken Fine Chemicals Co., Ltd., alumina sol F-3000), 10% by mass of a water-dispersible latex (manufactured by Asahi Kasei Corp., L7430), and 10% by mass of modified silicone oil (manufactured by Shin-Etsu Chemical Co., Ltd., KF-351A) were used.

Except for this, the same conditions as in [Example 1] described above were applied to obtain a flexographic printing raw plate and a flexographic printing plate.

Example 20

At the time of preparing the intermediate layer coating liquid described in [Manufacturing Example 4] in manufacturing the flexographic printing plate, 75% by mass of polyvinylpyrrolidone (PVP manufactured by Sigma-Aldrich Co. LLC., K60), 5% by mass of water-swellable synthetic mica (manufactured by Katakura & Co-op Agri Corporation, Somasif MEB-3 aqueous solution), 10% by mass of a water-dispersible latex (manufactured by Asahi Kasei Corp., L7430), and 10% by mass of modified silicone oil (manufactured by Shin-Etsu Chemical Co., Ltd., KF-351A) were used.

Except for this, the same conditions as in [Example 1] described above were applied to obtain a flexographic printing raw plate and a flexographic printing plate.

Example 21

At the time of preparing the intermediate layer coating liquid described in [Manufacturing Example 4] in manufacturing the flexographic printing plate, 75% by mass of poly2-ethyloxazolin (POx manufactured by Sigma-Aldrich Co. LLC., Mw: 50,000 or less), 5% by mass of water-swellable synthetic mica (manufactured by Katakura & Co-op Agri Corporation, Somasif MEB-3 aqueous solution), 10% by mass of a water-dispersible latex (manufactured by Asahi Kasei Corp., L7430), and 10% by mass of modified silicone oil (manufactured by Shin-Etsu Chemical Co., Ltd., KF-351A) were used.

Except for this, the same conditions as in [Example 1] described above were applied to obtain a flexographic printing raw plate and a flexographic printing plate.

Example 22

At the time of preparing the intermediate layer coating liquid described in [Manufacturing Example 4] in manufacturing the flexographic printing plate, 75% by mass of a water-soluble polyamide (PA, manufactured by Toray Industries, Inc., AQ Nylon T-70), 5% by mass of aluminum hydroxide particles (manufactured by KINSEI MATEC CO., LTD., Serath 05070), 10% by mass of a water-dispersible latex (manufactured by Asahi Kasei Corp., L7430), and 10% by mass of modified silicone oil (manufactured by Shin-Etsu Chemical Co., Ltd., KF-351A) were used.

Except for this, the same conditions as in [Example 1] described above were applied to obtain a flexographic printing raw plate and a flexographic printing plate.

Example 23

At the time of preparing the intermediate layer coating liquid described in [Manufacturing Example 4] in manufacturing the flexographic printing plate, 75% by mass of a water-soluble polyamide (PA, manufactured by Toray Industries, Inc., AQ Nylon T-70), 5% by mass of barium titanate particles (manufactured by Otsuka Chemical Co., Ltd., TISMO N), 10% by mass of a water-dispersible latex (manufactured by Asahi Kasei Corp., L7430), and 10% by mass of modified silicone oil (manufactured by Shin-Etsu Chemical Co., Ltd., KF-351A) were used.

Except for this, the same conditions as in [Example 1] described above were applied to obtain a flexographic printing raw plate and a flexographic printing plate.

Example 24

At the time of preparing the intermediate layer coating liquid described in [Manufacturing Example 4] in manufacturing the flexographic printing plate, 75% by mass of a water-soluble polyamide (PA, manufactured by Toray Industries, Inc., AQ Nylon T-70), 5% by mass of boehmite (manufactured by Kawaken Fine Chemicals Co., Ltd., alumina sol 5N), 10% by mass of a water-dispersible latex (manufactured by Asahi Kasei Corp., L7430), and 10% by mass of modified silicone oil (manufactured by Shin-Etsu Chemical Co., Ltd., KF-351A) were used.

Except for this, the same conditions as in [Example 1] described above were applied to obtain a flexographic printing raw plate and a flexographic printing plate.

Comparative Example 1

At the time of preparing the intermediate layer coating liquid described in [Manufacturing Example 4] in manufacturing the flexographic printing plate, 80% by mass of a water-soluble polyamide (PA, manufactured by Toray Industries, Inc., AQ Nylon T-70), 10% by mass of a water-dispersible latex (manufactured by Asahi Kasei Corp., L7430), and 10% by mass of modified silicone oil (manufactured by Shin-Etsu Chemical Co., Ltd., KF-351A) were used.

No layered inorganic compound was used.

Except for the above, the same conditions as in [Example 1] described above were applied to obtain a flexographic printing raw plate and a flexographic printing plate.

Comparative Example 2

Silica particles (manufactured by Nissan Chemical Corporation, SNOWTEX ST-30L aqueous dispersion) was used instead of the water-swellable synthetic mica (manufactured by Katakura & Co-op Agri Corporation, Somasif MEB-3 aqueous solution) at the time of preparing the intermediate layer coating liquid described in [Manufacturing Example 4] in manufacturing the flexographic printing plate.

Except for this, the same conditions as in [Example 1] described above were applied to obtain a flexographic printing raw plate and a flexographic printing plate.

Comparative Example 3

At the time of preparing the intermediate layer coating liquid described in [Manufacturing Example 4] in manufacturing the flexographic printing plate, application was carried out with the intermediate layer coating liquid adjusted so that the thickness of the intermediate layer was 1.5 µm.

Except for this, the same conditions as in [Example 1] described above were applied to obtain a flexographic printing raw plate and a flexographic printing plate.

Comparative Example 4

At the time of preparing the intermediate layer coating liquid described in [Manufacturing Example 4] in manufacturing the flexographic printing plate, application was carried out with the intermediate layer coating liquid adjusted so that the thickness of the intermediate layer was 40 µm.

Except for this, the same conditions as in [Example 1] described above were applied to obtain a flexographic printing raw plate and a flexographic printing plate.

Comparative Example 5

At the time of preparing the intermediate layer coating liquid described in [Manufacturing Example 4] in manufacturing the flexographic printing plate, 80% by mass of a polyvinyl alcohol (PVA manufactured by Kuraray Co., Ltd., POVAL PVA-205), 10% by mass of a water-dispersible latex (manufactured by Asahi Kasei Corp., L7430), and 10% by mass of modified silicone oil (manufactured by Shin-Etsu Chemical Co., Ltd., KF-351A) were used.

No layered inorganic compound was used.

Except for the above, the same conditions as in [Example 1] described above were applied to obtain a flexographic printing raw plate and a flexographic printing plate.

Comparative Example 6

In manufacturing the flexographic printing plate, the film having the infrared ablation layer described in [Manufacturing Example 3] was used instead of the cover film described in [Manufacturing Example 4].

Except for this, the same conditions as in [Example 1] described above were applied to obtain a flexographic printing raw plate and a flexographic printing plate.

While the unexposed part was removed using an aqueous developer in development treatment in Examples shown hereinabove, the manufacturing method of a flexographic printing plate in the present embodiment is not limited to these Examples, and development treatment may be carried out using a solvent-based developer.

[Characteristic Evaluation]
(Evaluation on Flexographic Printing Raw Plate)
<Evaluation for Pin Hole>

Each of the flexographic printing raw plates obtained in Examples and Comparative Examples was cut into five pieces with a size of 10 cm×10 cm to obtain samples.

The cover sheet of the infrared ablation layer of each of these samples was removed, each sample was then placed on a light table, and microscopic inspection was conducted thereon.

The number of pin holes with a long diameter of 20 µm or more in the infrared ablation layer was counted, and an averaged value was taken to calculate a value (number of pin holes/m$^2$), which was evaluated on the following 5-point scale. In the evaluation, those given a score of 3 or more can be practically used without any problem.

5: The number of pin holes is less than 2 (number of pin holes/m$^2$) on average.

4: The number of pin holes is 2 (number of pin holes/m$^2$) or more and less than 5 (number of pin holes/m$^2$) on average.

3: The number of pin holes is 5 (number of pin holes/m$^2$) or more and less than 10 (number of pin holes/m$^2$) on average.

2: The number of pin holes is 10 (number of pin holes/m$^2$) or more and less than 20 (number of pin holes/m$^2$) on average.

1: The number of pin holes is 20 (number of pin holes/m$^2$) or more on average.

<Evaluation for Pin Hole after Storage Under High Humidity>

The cover film having the intermediate layer and the infrared ablation layer obtained in [Manufacturing Example 4] described above was stored for one week under an environment of 40° C. and 10% relative humidity.

Thereafter, a flexographic printing raw plate was produced in the same manner as in [Example 1], and the flexographic printing raw plate was cut into five pieces with a size of 10 cm×10 cm to obtain samples.

The cover sheet of the infrared ablation layer of each of these samples was removed, each sample was then placed on a light table, and microscopic inspection was conducted thereon.

The number of pin holes with a long diameter of 20 µm or more in the infrared ablation layer was counted, and an averaged value was taken to calculate a value (number of pin holes/m$^2$), which was evaluated on to the following 5-point scale. In the evaluation, those given a score of 3 or more can be practically used without any problem.

5: The number of pin holes is less than 2 (number of pin holes/m$^2$) on average.

4: The number of pin holes is 2 (number of pin holes/m$^2$) or more and less than 5 (number of pin holes/m$^2$) on average.

3: The number of pin holes is 5 (number of pin holes/m$^2$) or more and less than 10 (number of pin holes/m$^2$) on average.

2: The number of pin holes is 10 (number of pin holes/m$^2$) or more and less than 20 (number of pin holes/m$^2$) on average.

1: The number of pin holes is 20 (number of pin holes/m$^2$) or more on average.

<Evaluation for Cleanability>

The flexographic printing raw plate was exposed from the side of the support for 60 seconds using an ultraviolet light exposure apparatus "JE-A2-SS" (manufactured by Nihon Denshi Seiki Co., Ltd., trade name)

Thereafter, the cover sheet, which was the upper layer of the infrared ablation layer, was peeled, the support side thereof was brought into contact with and mounted on a rolling drum of CDI Spark4260 (manufactured by ESKO GRAPHICS B.V., trade name), and a 1% halftone (AM 150 lines/inch) was drawn (resolution: 2540 dpi) on the infrared ablation layer using a Fiber laser (wavelength: 1070 nm) at output of 18.2 W and rotation speed of 200 rpm. Thereafter, exposure was conducted for 12 minutes using the above-described exposure apparatus (illuminance: 10 mW).

Then, washing was carried out at 40° C. by a horizontal washing machine (manufactured by Robo Denshi) using an aqueous developer containing, as a surfactant, 5 parts by mass of "LEOCOL SC-80" (Lion Specialty Chemicals Co., Ltd., trade name, HLB 12.7), which was a 5-mole ethylene oxide adduct of secondary alcohols having 12 to 14 carbon atoms, 1 part by mass of dibutyl diethylene glycol as a penetrating agent, and 0.4 parts by mass of sodium carbonate. After a washing time of one minute, two minutes, and three minutes, removal status of the infrared ablation layer at the non-imaged part was observed. Thereafter, washing was further carried out for 17 minutes so that the total washing time was 20 minutes.

Drying was subsequently carried out at 60° C. for 15 minutes, and post exposure treatment was conducted using a chemical lamp and a sterilization lamp.

The observation results of removal status of the infrared ablation layer were evaluated on the following scale.

In the following evaluation scale, those given a score of 3 or more can be practically used without any problem.

5: The infrared ablation layer was uniformly removed in a washing time of one minute.

4: The infrared ablation layer was not uniformly removed in a washing time of one minute but was uniformly removed in a washing time of two minutes.

3: The infrared ablation layer was not uniformly removed in a washing time of two minutes but was uniformly removed in a washing time of three minutes.

2: The infrared ablation layer was removed in the general washing time (20 minutes).

1: Unevenness was remained, and the infrared ablation layer was not uniformly removed.
(Evaluation on Flexographic Printing Plate)

Actual printing evaluation was conducted using the flexographic printing plates obtained in Examples and Comparative Examples.

Flexographic printer AI-3 model (manufactured by Iyokikai Seisakusho) was used, process X cyan (manufactured by TOYO INK CO., LTD., trade name) was used as solvent ink, and an OPP film was used as an object to be printed.

An anilox roll with 800 lpi (cell volume: 3.8 cm$^3$/m$^2$) was used, and 3M1020 (manufactured by Sumitomo 3M Limited, trade name) was used as a cushion tape. Printing was carried out for 3000 m at a printing rate of 100 m/minute.
<Reproducibility of Small Dots on Printed Matter>

Printed matter reproducibility was evaluated, and specifically, it was observed whether the shape and size of the top part of the halftone formed on the flexographic printing plate were the same as the shape and size of the halftone on a printed matter or not.

In this evaluation, small dots (part of AM 150 lpi, 1% halftone) in a halftone image part on the flexographic printing plate were observed by FLEX 3PRO (manufactured by Avid Flex CO., LTD.), and the halftone on the printed matter was observed by a 150-power microscope (manufactured by KEYENCE CORPORATION, VHX-1000).

The evaluation scale for the observation results were shown below.

In the following evaluation scale, those given a score of 3 or more can be practically used without any problem.

4: Both of the top part of halftone dots on the flexographic printing plate and the halftone on a printed matter are circle, and the shape and the size both have high reproducibility.

3: While both of the top part of halftone dots on the flexographic printing plate and the halftone on a printed matter are circle, the halftone size has poor reproducibility.

2: While the top part of halftone dots on the flexographic printing plate is circle, the halftone on a printed matter is ellipse, slur is observed, and reproducibility is poor.

1: The top part of halftone dots on the flexographic printing plate rounds, and formation failure occurs. Also, dots were not printed on a printed matter.
<Ink Adhesion>

With respect to the flexographic printing plate obtained after printing for 3000 m described above, dots and concave parts between dots in a 3% halftone and a 30% halftone of the halftone part of the flexographic printing plate were observed with a magnifier.

The evaluation scale for the observation results were shown below.

In the following evaluation scale, those given a score of 2 or more can be practically used without any problem.

3: Ink adheres to solely the upper layer of a shoulder part of dots.

2: Ink flows to an intermediate part of dots. 1: Ink flows to a bottom part between dots.
(Film Thickness of Intermediate Layer)

The flexographic printing raw plate was exposed from the support side for 600 seconds using an ultraviolet light exposure apparatus. After photocuring the plate, the sample was processed by a focused ion beam (FIB) apparatus, and the exposed cross-section was observed using a scanning electron microscope (SEM) to evaluate the film thickness of the intermediate layer.
(Gel Fraction of Intermediate Layer)

The intermediate layer coating liquid obtained in [Manufacturing Example 4] described above was dried to obtain a solid. The mass of the obtained solid was weighed. Thereafter, the solid of the intermediate layer was immersed in pure water at room temperature for 72 hours and subsequently dried at 50° C. for three hours, and the mass of the resulting solid was weighed. The value obtained according to the following equation was taken as the gel fraction.

Gel fraction (%)=(mass of intermediate layer having been immersed in pure water at room temperature for 72 hours and subsequently dried at 50° C. for three hours/mass of intermediate layer before being immersed in pure water)×100

The composition of the intermediate layer used for the flexographic printing raw plates and flexographic printing plates, the thickness and gel fraction of the intermediate layer, and the evaluation results in Examples 1 to 24 and Comparative Examples 1 to 6 are shown in Table 1 and Table 2 below.

TABLE 1

| | Intermediate layer | | | | | | (C) Water-dispersible latex | | (C)/(A) × 100 | Silicone | | Film thickness | Gel fraction |
|---|---|---|---|---|---|---|---|---|---|---|---|---|---|
| | (A) Hydrophilic resin | | (B) Layered inorganic compound | | (B)/(A) × 100 | | Type | | | | (mass %) | | |
| | | | Type | | | | | | | | | | |
| Example 1 | PA | 75 mass % | Somasif MEB-3 | Water swellable synthetic mica | 5 mass % | 7 | L7430 | SBR-Lx | 10 mass % | 13 | KF-351 | 10 mass % | 3 μm | 70% |
| Example 2 | CMC | 75 mass % | Somasif MEB-3 | Water swellable synthetic mica | 5 mass % | 7 | L7430 | SBR-Lx | 10 mass % | 13 | KF-351 | 10 mass % | 3 μm | 0% |
| Example 3 | PVA | 75 mass % | Somasif MEB-3 | Water swellable synthetic mica | 5 mass % | 7 | L7430 | SBR-Lx | 10 mass % | 13 | KF-351 | 10 mass % | 3 μm | 0% |
| Example 4 | PU | 75 mass % | Somasif MEB-3 | Water swellable synthetic mica | 5 mass % | 7 | L7430 | SBR-Lx | 10 mass % | 13 | KF-351 | 10 mass % | 3 μm | 80% |
| Example 5 | PA | 55 mass % | Somasif MEB-3 | Water swellable synthetic mica | 10 mass % | 18 | L7430 | SBR-Lx | 10 mass % | 18 | KF-351 | 10 mass % | 3 μm | 70% |
| Example 6 | PA | 70 mass % | Somasif MEB-3 | Water swellable synthetic mica | 10 mass % | 14 | L7430 | SBR-Lx | 10 mass % | 14 | KF-351 | 10 mass % | 3 μm | 70% |
| Example 7 | PA | 79 mass % | Somasif MEB-3 | Water swellable synthetic mica | 1 mass % | 1 | L7430 | SBR-Lx | 10 mass % | 13 | KF-351 | 10 mass % | 3 μm | 30% |
| Example 8 | PA | 75 mass % | Somasif ME-100 | Water swellable synthetic mica | 5 mass % | 7 | L7430 | SBR-Lx | 10 mass % | 13 | KF-351 | 10 mass % | 3 μm | 70% |
| Example 9 | PA | 75 mass % | KUNIPIA-F | Natural montmorillonite | 5 mass % | 7 | L7430 | SBR-Lx | 10 mass % | 13 | KF-351 | 10 mass % | 3 μm | 70% |
| Example 10 | PA | 75 mass % | SUMECTON-ST | Synthetic smectite | 5 mass % | 7 | L7430 | SBR-Lx | 10 mass % | 13 | KF-351 | 10 mass % | 3 μm | 70% |
| Example 11 | PA | 75 mass % | Somasif MEB-3 | Water swellable synthetic mica | 5 mass % | 7 | L7430 | SBR-Lx | 10 mass % | 13 | KF-351 | 10 mass % | 2.0 μm | — |
| Example 12 | PA | 75 mass % | Somasif MEB-3 | Water swellable synthetic mica | 5 mass % | 7 | L7430 | SBR-Lx | 10 mass % | 13 | KF-351 | 10 mass % | 10 μm | — |
| Example 13 | PA | 75 mass % | Somasif MEB-3 | Water swellable synthetic mica | 5 mass % | 7 | L7430 | SBR-Lx | 10 mass % | 13 | KF-351 | 10 mass % | 30 μm | — |
| Example 14 | PA | 60 mass % | Somasif MEB-3 | Water swellable synthetic mica | 5 mass % | 8 | L7430 | SBR-Lx | 25 mass % | 42 | KF-351 | 10 mass % | 3 μm | 80% |
| Example 15 | PA | 80 mass % | Somasif MEB-3 | Water swellable synthetic mica | 5 mass % | 6 | L7430 | SBR-Lx | 5 mass % | 6 | KF-351 | 10 mass % | 3 μm | 60% |
| Example 16 | PA | 85 mass % | Somasif MEB-3 | Water swellable synthetic mica | 5 mass % | 6 | XL-006 | SBR-Lx | 10 mass % | 13 | KF-351 | 10 mass % | 3 μm | 70% |
| Example 17 | PA | 75 mass % | Somasif MEB-3 | Water swellable synthetic mica | 5 mass % | 7 | None | SBR-Lx | 0 mass % | 0 | KF-351 | 10 mass % | 3 μm | 0% |
| Example 18 | PA | 75 mass % | Somasif MEB-3 | Water swellable synthetic mica | 5 mass % | 7 | SX1503A | NBR-Lx | 8 mass % | 11 | KF-351 | 10 mass % | 3 μm | 70% |
| Example 19 | PA | 75 mass % | Alumina sol F-3000 | Aluminum hydroxide | 5 mass % | 7 | L7430 | SBR-Lx | 10 mass % | 13 | KF-351 | 10 mass % | 3 μm | 50% |
| Example 20 | PVP | 75 mass % | Somasif MEB-3 | Water swellable synthetic mica | 5 mass % | 7 | L7430 | SBR-Lx | 10 mass % | 13 | KF-351 | 10 mass % | 3 μm | 90% |
| Example 21 | POx | 75 mass % | Somasif MEB-3 | Water swellable synthetic mica | 5 mass % | 7 | L7430 | SBR-Lx | 10 mass % | 13 | KF-351 | 10 mass % | 3 μm | 10% |
| Example 22 | PA | 75 mass % | Serath 05070 | Aluminum hydroxide | 5 mass % | 7 | L7430 | SBR-Lx | 10 mass % | 13 | KF-351 | 10 mass % | 3 μm | 70% |
| Example 23 | PA | 75 mass % | TISMO N | Potassium titanate | 5 mass % | 7 | L7430 | SBR-Lx | 10 mass % | 13 | KF-351 | 10 mass % | 3 μm | 70% |
| Example 24 | PA | 75 mass % | Alumina sol 5N | Aluminum hydroxide | 5 mass % | 7 | L7430 | SBR-Lx | 10 mass % | 13 | KF-351 | 10 mass % | 3 μm | 50% |
| Comp. Ex. 1 | PA | 80 mass % | None | | 0 mass % | 0 | L7430 | SBR-Lx | 10 mass % | 13 | KF-351 | 10 mass % | 3 μm | 70% |
| Comp. Ex. 2 | PA | 75 mass % | SNOWTEX ST-30L | Silica particles | 5 mass % | 7 | L7430 | SBR-Lx | 10 mass % | 13 | KF-351 | 10 mass % | 3 μm | 0% |
| Comp. Ex. 3 | PA | 75 mass % | Somasif MEB-3 | Water swellable synthetic mica | 5 mass % | 7 | L7430 | SBR-Lx | 10 mass % | 13 | KF-351 | 10 mass % | 1.5 μm | — |
| Comp. Ex. 4 | PA | 75 mass % | Somasif MEB-3 | Water swellable synthetic mica | 5 mass % | 7 | L7430 | SBR-Lx | 10 mass % | 13 | KF-351 | 10 mass % | 40 μm | — |
| Comp. Ex. 5 | PVA | 80 mass % | None | | 0 mass % | 0 | L7430 | SBR-Lx | 10 mass % | 13 | KF-351 | 10 mass % | 3 μm | 0% |
| Comp. Ex. 6 | None | 0 mass % | None | | 0 mass % | 0 | — | — | — | 0 | None | 0 mass % | None | — |

TABLE 2

| | Evaluation | | | | |
|---|---|---|---|---|---|
| | Evaluation for pin hole | Evaluation for pin hole [Storage under high humidity] | Evaluation for cleanability | Reproducibility of small dots on printed matter | Ink adhesion |
| Example 1 | 5 | 5 | 5 | 4 | 3 |
| Example 2 | 5 | 3 | 5 | 4 | 3 |
| Example 3 | 5 | 3 | 5 | 4 | 3 |
| Example 4 | 5 | 5 | 4 | 4 | 3 |
| Example 5 | 5 | 5 | 5 | 4 | 1 |
| Example 6 | 5 | 5 | 5 | 4 | 2 |
| Example 7 | 3 | 4 | 5 | 3 | 3 |
| Example 8 | 5 | 5 | 5 | 4 | 3 |
| Example 9 | 5 | 5 | 5 | 4 | 3 |
| Example 10 | 5 | 5 | 5 | 4 | 3 |
| Example 11 | 3 | 4 | 5 | 3 | 3 |
| Example 12 | 5 | 4 | 4 | 4 | 3 |
| Example 13 | 5 | 4 | 3 | 4 | 2 |
| Example 14 | 5 | 5 | 5 | 3 | 3 |
| Example 15 | 5 | 4 | 3 | 4 | 2 |
| Example 16 | 5 | 5 | 5 | 4 | 3 |
| Example 17 | 5 | 3 | 3 | 4 | 3 |
| Example 18 | 5 | 5 | 5 | 4 | 3 |
| Example 19 | 5 | 4 | 5 | 3 | 3 |
| Example 20 | 5 | 5 | 3 | 4 | 3 |
| Example 21 | 5 | 3 | 5 | 4 | 3 |
| Example 22 | 5 | 5 | 5 | 4 | 3 |
| Example 23 | 5 | 5 | 5 | 4 | 3 |
| Example 24 | 5 | 4 | 5 | 3 | 3 |
| Comparative Example 1 | 1 | 1 | 2 | 1 | 3 |
| Comparative Example 2 | 2 | 2 | 3 | 1 | 3 |
| Comparative Example 3 | 1 | 1 | 5 | 2 | 3 |
| Comparative Example 4 | 5 | 5 | 1 | 4 | 1 |
| Comparative Example 5 | 1 | 1 | 2 | 2 | 3 |
| Comparative Example 6 | 1 | 1 | 1 | 1 | 3 |

The present application is based on the Japanese patent application (Japanese Patent Application No. 2018-230516) filed with Japan Patent Office on Dec. 10, 2018, and the contents thereof are incorporated herein by reference.

INDUSTRIAL APPLICABILITY

The flexographic printing raw plate and flexographic printing plate of the present invention have industrial applicability in a field of printing requiring prevention of plate surface stains and brightness.

The invention claimed is:

1. A flexographic printing raw plate comprising at least a support, a photosensitive resin composition layer, an intermediate layer, and an infrared ablation layer sequentially stacked, wherein
the intermediate layer comprises a hydrophilic resin (A), a layered inorganic compound (B), and a water-dispersible latex (C), and
the intermediate layer has a film thickness of 2 μm or more and 30 μm or less.

2. The flexographic printing raw plate according to claim 1, wherein
the intermediate layer comprises 5 to 45 parts by mass of the water-dispersible latex (C) per 100 parts by mass of the hydrophilic resin (A).

3. The flexographic printing raw plate according to claim 1, wherein
the layered inorganic compound (B) contains a clay mineral,
wherein the hydrophilic resin (A) includes a functional group enabling formation of a covalent bond and/or an ion bond with the clay mineral.

4. The flexographic printing raw plate according to claim 1, wherein
the intermediate layer comprises 0.1 to 20 parts by mass of the layered inorganic compound (B) per 100 parts by mass of the hydrophilic resin (A).

5. The flexographic printing raw plate according to claim 1, wherein
the layered inorganic compound (B) is water-swellable synthetic mica.

6. The flexographic printing raw plate according to claim 1, wherein
a gel fraction of the intermediate layer is 10% or more and 90% or less, the gel fraction being calculated according to the following equation:
gel fraction (%)=(mass of intermediate layer having been immersed in pure water at room temperature for 72 hours followed by drying at 50° C. for three hours/mass of intermediate layer before being immersed in pure water)×100.

7. A manufacturing method of a flexographic printing plate, comprising:
producing a negative pattern by subjecting the infrared ablation layer of the flexographic printing raw plate according to claim 1 to laser ablation;

selectively exposing the photosensitive resin composition layer through the negative pattern; and
removing an unexposed part of the photosensitive resin composition layer.

* * * * *